US005572394A

United States Patent [19]
Ker et al.

[11] Patent Number: 5,572,394
[45] Date of Patent: Nov. 5, 1996

[54] CMOS ON-CHIP FOUR-LVTSCR ESD PROTECTION SCHEME

[75] Inventors: Ming-Dou Ker, Tainan; Tain-Shun Wu, Miou-Lee, both of Taiwan

[73] Assignee: Industrial Technology Research Institute, Hsinchu, Taiwan

[21] Appl. No.: 419,650

[22] Filed: Apr. 6, 1995

[51] Int. Cl.$^6$ .................................................. H02H 9/00
[52] U.S. Cl. ............................ 361/56; 361/91; 361/111; 361/118
[58] Field of Search ............................. 361/18, 56, 58, 361/91, 100, 111, 118, 119, 126, 127; 257/107, 109, 110, 112, 355–357, 360–363; 327/309, 310, 314, 318, 320, 325, 326

[56] References Cited

U.S. PATENT DOCUMENTS

| | | | |
|---|---|---|---|
| 4,605,980 | 8/1986 | Hartranft et al. | 361/56 |
| 4,692,781 | 9/1987 | Rountree et al. | 357/23.13 |
| 4,734,752 | 3/1988 | Liu et al. | 357/23.4 |
| 4,745,450 | 5/1988 | Hartranft et al. | 357/23.13 |
| 4,807,080 | 2/1989 | Clark | 361/56 |
| 4,819,046 | 4/1989 | Misu | 357/23.13 |
| 4,896,243 | 1/1990 | Chatterjee et al. | 362/91 |
| 4,939,616 | 7/1990 | Rountree | 361/56 |
| 5,001,529 | 3/1991 | Ohshima et al. | 357/23.13 |
| 5,010,380 | 4/1991 | Avery | 357/23.13 |
| 5,012,317 | 4/1991 | Rountree | 357/38 |
| 5,019,888 | 5/1991 | Scott et al. | 357/41 |
| 5,077,591 | 12/1991 | Chen et al. | 357/23.1 |
| 5,140,401 | 8/1992 | Ker et al. | 357/43 |
| 5,166,089 | 11/1992 | Chen et al. | 437/51 |
| 5,182,220 | 1/1993 | Ker et al. | 437/34 |
| 5,218,222 | 6/1993 | Roberts | 257/362 |
| 5,270,565 | 12/1993 | Lee et al. | 257/358 |
| 5,272,371 | 12/1993 | Bishop et al. | 257/362 |
| 5,274,262 | 12/1993 | Avery | 257/362 |
| 5,289,334 | 2/1994 | Ker et al. | 361/56 |
| 5,329,143 | 7/1994 | Chan et al. | 257/173 |
| 5,336,908 | 8/1994 | Roberts | 257/173 |
| 5,343,053 | 8/1994 | Avery | 257/173 |

OTHER PUBLICATIONS

C. Duvvury and A. Amerasekera, "ESD: A Pervasive Reliability Concern for IC Technologies", *Proc. of IEEE*, vol. 81, No. 5, pp. 690–702, May 1993.

A. Amerasekera and C. Duvvury, "The Impact of Technology Scaling on ESD Robustness and Protection Circuit Design", 1994 *EOS/ESD Symp. Proc.*, EOS–16, pp. 237–245. No Month.

R. N. Rountree, "ESD Protection for Submicron CMOS Circuits: Issues and Solutions", 1988 *IEDM Technical Digest*, pp. 580–583. No Month.

R. N. Rountree, C. Duvvury, T. Maki, and H. Stiegler, "A Process–Tolerant Input Protection Circuit for Advanced CMOS Processes", 1988 *EOS/ESD Symp. Proc.* EOS–10, pp. 201–205. No Month.

(List continued on next page.)

*Primary Examiner*—Jeffrey A. Gaffin
*Assistant Examiner*—Ronald W. Leja
*Attorney, Agent, or Firm*—Meltzer, Lippe, Goldstein et al.

[57] ABSTRACT

An on-chip ESD protection circuit for use in a submicron CMOS integrated circuit (IC) has been disclosed. The ESD protection circuit provides a high ESD failure threshold in a small layout area to protect the input stage of the submicron CMOS IC against ESD failure. The ESD protection circuit is formed by a PTLSCR1, PTLSCR2 devices and an NTLSCR1, NTLSCR2 devices. The PTLSCR1 or PTLSCR2 (NTLSCR1 or NTLSCR2) is formed by inserting a short-channel thin-oxide PMOS (NMOS) device into the lateral SCR structure. These MOS devices are used to reduce the turn-on voltage of the lateral SCR to below the gate-oxide breakdown voltage of the CMOS devices in the input stage. Thus these PTLSCR1, PTLSCR2, NTLSCR1 and NTLSCR2 devices perform full ESD protection without additional secondary ESD protection elements. The four modes of ESD, PS, NS, PD and ND, are one-by-one protected by the NTLSCR1, NTLSCR2, PTLSCR1 and PTLSCR2 devices respectively.

6 Claims, 15 Drawing Sheets

OTHER PUBLICATIONS

C. Duvvury, T. Taylor, J. Lindgren, J. Morris, and S. Kumar, "Input Protection Design for Overall Chip Reliability", 1989 *EOS/ESD Symp. Proc.*, EOS–11, pp. 190–197. No Month.

G. Rieck and R. Manely, "Novel ESD Protection for Advanced CMOS Output Drivers", 1989 *EOS/ESD Symp. Proc.*, EOS–11, pp. 182–189. No Month.

C. Duvvury and R. Rountree, "A Synthesis of ESD Input Protection Scheme", 1991 *EOS/ESD Symp. Proc.*, EOS–13, pp. 88–97. No Month.

C.-Y. Wu, M.-D. Ker, C.-Y. Lee, and J. Ko, "A New On–Chip ESD Protection Circuit with Dual Parasitic SCR Structures for CMOS VLSI", 1992 *IEEE Journal of Solid–State Circuits*, vol. 27, No. 3, pp. 274–280. No Month.

M.-D. Ker, C.-Y. Wu, and C.-Y. Lee, "A Novel CMOS ESD/EOS Protection Circuit with Full–SCR Structures", 1992 *EOS/ESD Symp. Proc.*, EOS–14, pp. 258–264. No Month.

M.-D. Ker and C.-Y. Wu, "CMOS On–Chip Electrostatic Discharge Protection Circuit Using Four–SCR Structures with Low ESD–Trigger Voltage", 1994 *Solid–State Electronics*, vol. 37, No. 1, pp. 17–26. No Month.

A. Chatterjee and T. Polgreen, "A Low–Voltage Triggering SCR for On–Chip ESD Protection at Output and Input Pads", *IEEE Electron Device Letters*, vol. 12, No. 1, pp. 21–22, Jan. 1991.

A. Chatterjee and T. Polgreen, "A Low–Voltage Triggering SCR for On–Chip ESD Protection at Output and Intput Pads", 1990 *Proc. Symposium on VLSI Technology*, pp. 75–76. No Month.

C. Duvvury, R. N. Rountree, and O. Adams, "Internal Chip ESD Phenomena Beyond the Protection Circuit", *IEEE Trans. on Electron Devices*, vol. 35, No. 12, pp. 2133–2139, Dec., 1988.

X. Guggenmos and R. Holzner, "A New ESD Protection Concept for VLSI CMOS Circuits Avoiding Circuit Stress", 1991 *EOS/ESD Symp. Proc.*, EOS–13, pp. 74–82. No Month.

H. Terletzki, W. Nikutta, and W. Reczek, "Influence of the Series Resistance of On–Chip Power Supply Buses on Internal Device Failure after ESD Stress", *IEEE Trans. on Electron Devices*, vol. 40, No. 11, pp. 2081–2083, Nov., 1993.

C. Johnson, T. J. Maloney, and S. Qawami, "Two Unusual HBM ESD Failure Mechanisms on a Mature CMOS Process", 1993 *EOS/ESD Symp. Proc.*, EOS–15, pp. 225–231. No Month.

C. Duvvury, R. A. McPhee, D. A. Baglee, and R. N. Rountree, "ESD Protection Reliability in 1–µm CMOS Technologies", 1986 *IRPS Proc.*, pp. 199–205. No Month.

S. Daniel and G. Krieger, "Process and Design Optimization for Advanced CMOS I/O ESD Protection Devices", 1990 *EOS/ESD Symp. Proc.*, EOS–12, pp. 206–213. No Month.

Y. Wei, Y. Loh, C Wang, and C. Hu, "MOSFET Drain Engineering for ESD Performance", 1992 *EOS/ESD Symp. Proc.*, EOS–14 pp. 143–148. No Month.

T. L. Polgreen and A. Chatterjee, "Improving the ESD Failure Threshold of Silicided n–MOS Output Transistors by Ensuring Uniform Current Flow", 1992 *IEEE Trans. Electron Devices*, vol. 39, No. 2, pp. 379–388. No Month.

C. Duvvury, C. Diaz, and T. Haddock, "Achieving Uniform nMOS Device Power Distribution for Submicron ESD Reliability", 1992 *IEDM Technical Digest*, pp. 131–134. No Month.

C. Duvvury, and C. Diaz, "Dynamic Gate Coupling of NMOS for Efficient Output ESD Protection", 1992 *Proc. of IRPS*, pp. 141–150. No Month.

Baker, R. Currence, S. Law, M. Le, C. Lee, S. T. Lin & M. Teene, "A Waffle Layout Technique Strengthens the ESD Hardness of the NMOS Output Transistor", 1989 EOS/ESD Symp. Proc. EOS–11, pp. 175–181. No Month.

Y.-S. Hu, H.-R. Liah, and M.-C. Chang, "High Density Input Protection Circuit Design In 1.2 µm CMOS Technology", 1987 *EOS/ESD Symp. Proc.*, EOS–9, pp. 179–185. No Month.

S. R. Vemura, "Layout Comparison of MOSFETs With Large W/L Ratios" 1992 *Electronics Letters, vol. 28, No. 25*, pp. 2327–2329. No Month.

5,572,394

CM OS ON-CHIP FOUR-LVTSCR ESD PROTECTION SCHEME

RELATED APPLICATIONS

The following patent applications are assigned to the assignee hereof and contain subject matter related to the subject matter of the present patent application:

1. U.S. patent application Ser. No. 08/419,638, entitled "Latchup-Free Fully-Protected CMOS On-Chip ESD Protection Circuit", filed on even date herewith for Ming-Dou KER and Tain-Shun WU, 2. U.S. patent application Ser. No. 08/419,636, entitled "CMOS Output Buffer With Enhanced High ESD Protection Capability", filed on even date herewith for Ming-Dou KER and Tain-Shun WU, and 3. U.S. patent application Ser. No. 08/419,637, entitled "N-Sided Polygonal Cell Layout For Multiple Cell Transistor", filed on even date herewith for Ming-Dou KER, Tain-Shun WU and Kuo-Feng WANG. The contents of the above-listed patent applications are incorporated herein by reference.

FIELD OF THE INVENTION

The present invention relates to a CMOS on-chip circuit having four-LVTSCRs (Low-Voltage Trigger SCR) to fully-protect packaged internal integrated circuits (ICs) from undesired high voltage spikes resulting from electrostatic discharges (ESDs) caused for example by handling. In particular, the present invention provides four ESD paths to directly protect the internal circuits against four ESD stress modes.

BACKGROUND OF THE INVENTION

Electrostatic discharges (ESDs) from human handling of a metal-oxide silicon (MOS) IC chip or from other causes permanently damage the IC chip. Often the thin-oxide layer that isolates the gate electrode from the substrate of a MOS field effect transistor is irreparably ruptured by a voltage spike applied across it. A voltage spike or ESD is often applied to the gate because the gate electrode is connected to an external terminal or pin of the IC chip. The external terminals are formed on an input or output pad. To prevent such damage from excessive electrostatic discharges, a protective device is often connected between the pad and the internal circuits.

As CMOS technology is scaled down into the submicron regime, the processes and the structures, such as thinner gate oxide, shorter channel length, shallower source/drain junction, LDD(Lightly-Doped Drain) structure, and silicided diffusion, greatly degrade the ESD robustness of submicron CMOS ICs. The submicron CMOS devices, such as short channel thin-oxide MOS devices, are extremely susceptible to ESD damage. Therefore, ESD protection has become one of the most important elements with respect to the reliability of submicron CMOS ICs. The following two references discuss the degraded ESD robustness of submicron CMOS ICs.

[1] C. Duvvury and A. Amerasekera, "ESD: A Pervasive Reliability Concern for IC Technologies", *Proc. of IEEE*, vol. 81, no. 5, pp. 690–702, May 1993, and

[2] A. Amerasekera and C. Duvvury, "The Impact of Technology Scaling on ESD Robustness and Protection Circuit Design", 1994 *EOS/ESD Syrup. Proc.*, EOS-16, pp. 237–245.

To improve ESD protection capability of a CMOS on-chip ESD protection circuit, a lateral semiconductor controlled rectifier (SCR) device has been used as a main ESD protection element in CMOS ICs to bypass ESD stress.

FIG 1a shows an SCR 100, often called a thyristor, which is a three terminal device having an anode 110, a cathode 120 and a gate 130. FIG 1b shows the four layer geometry of a lateral SCR device comprising a P-N-P-N structure. Normally, the SCR is off and does not conduct between its anode 110 and cathode 120. A small current $i_G$ (a few milliamps), which flows through the gate 130, initiates switching of the SCR 100 to a conducting state. A DC switching voltage VG, which is applied to the gate 130 through a resistor $R_G$, provides the current $i_G$. This turns on the SCR 100 and allows a large current i to flow from the anode 110 to the cathode 120.

FIG 1c shows the I-V characteristic of the SCR 100, where the vertical axis 150 represents the current i flowing from the anode 110 to the cathode 120 and the horizontal axis 160 represents the voltage v across the SCR 100 between its anode 110 and its cathode 120 as shown in FIG 1a. When the current i is reduced below a critical value, called a holding current $i_h$, then the SCR 100 is turned off. That is, the SCR 100 is switched from the conducting state to a blocking or non-conducting state.

The DC switching voltage of a lateral SCR device in a submicron process is around 30V to about 50V as indicated in the following references:

[3] R. N. Rountree, "ESD Protection for Submicron CMOS Circuits: Issues and Solutions" 1988 *IEDM Technical Digest*, pp. 580–583,

[4] R. N. Rountree, C. Cuvvury, T. Maki, and H. Stiegler, "A Process-Tolerant Input Protection Circuit for Advanced CMOS Processes", 1988 *EOS/ESD Symp. Proc.* EOS-10, pp. 201–205,

[5] C. Duvvury, T. Taylor, J. Lindgren, J. Morris, and S. Kumar, "Input Protection Design for Overall Chip Reliability", 1989 *EOS/ESD Symp. Proc.*, EOS-11, pp. 190–197,

[6] A. Chatterjee and C. Duvvury, "Efficient ESD Input Protection Scheme," U.S. Pat. No. 4,896,243, 1990.

[7] G. N. Roberts, "Input ESD Protection Circuit", U.S. Pat. No. 5,336,908, 1994, and

[8] R. N. Rountree, "Electrostatic Discharge Protection Circuit" U.S. Pat. No. 5,012,317 1990.

An SCR having a switching voltage from 30 to 50 volts is inadequate to protect thin oxide CMOS devices. For example, using an approximately 0.6–0.8 μm CMOS process, the gate-oxide thickness of the CMOS devices is only around 150–200 Å. Such a thin gate-oxide will be damaged by a voltage of about 15 to 20 volts across it because the dielectric breakdown strength of $SiO_2$ is about 10 MV/cm. Thus, the lateral SCR device a switching voltage of 30 V to 50 V can not protect the gate oxide of a CMOS input stage alone without additional secondary ESD protection elements.

Several of the references cited above, namely reference numbers [3] to [7], have reported designing the lateral SCR device with secondary protection elements to complete the overall ESD protection function. But, the additional secondary protection elements occupy greater layout area. This is undesirable as it prevents fabrication of compact ESD protected CMOS IC chips.

Thus, if the switching voltage of a lateral SCR device can be reduced below the gate-oxide breakdown voltage of CMOS devices, then the lateral SCR device can alone perform the sufficient ESD protection capability in a minimum layout area. In contrast, other ESD protection elements, such as diodes, thick-oxide devices, gate oxide devices, and parasitic bipolar devices in CMOS IC's do not provide such an efficient ESD protection in the smallest layout area possible.

Certain references have modified the structure of the lateral SCR device to lower its switching voltage in submicron CMOS technologies. One such reference is:

[9] G. Rieck and R. Manely, "Novel ESD Protection for Advanced CMOS Output Drivers", 1989 *EOS/ESD Symp. Proc.*, EOS-11, pp. 182–189.

In order to lower the switching voltage of the lateral SCR device, the Rieck reference uses an oversized "NLCS" mask to make a "recessed filed threshold region" along the P-N-P-N structure of the lateral SCR device. However, this method increases both the process complexity and the difficulty of controlling the device performance.

Another lateral SCR device structure has been proposed by the following two references:

[10] C. Duvvury and R. Rountree, "A Synthesis of ESD Input Protection Scheme", 1991 *EOS/ESD Syrup. Proc.*, EOS-13, pp. 88–97, and

[11] R. N. Rountree, "Circuit Structure with Enhanced Electrostatic Discharge Protection", U.S. Pat. No. 4,939,616, 1990.

These two references [10] and [11] propose a modified lateral SCR (MLSCR) structure wherein an $N^+$ diffusion is made across the junction edge between an N-well and a P-substrate. This lowers the switching voltage of the MLSCR device to about 23 V. However, secondary protection elements are still needed to complete the ESD protection function.

The following reference [12] proposed a voltage-stress-induced lateral SCR device.

[12] L. R. Avery, "Voltage Stress Alterable ESD Protection Structure," U.S. Pat. No. 5,010,380, 1991.

Initially, the voltage-stress-induced lateral SCR device of Avery is not an SCR device. As its name implies, it is the voltage-stress which induces this device to behave like an SCR. That is, after a voltage-stress, this device has the I-V characteristics of an SCR device.

In the two following references [13]–[14],

[13] L. R. Very, "SCR Protection Structure and Circuit with Reduced Trigger Voltage", U.S. Pat. No. 5,274,262, 1993, and

[14] L. R. Avery, "SCR Electrostatic Discharge Protection for Integrated Circuits", U.S. Pat. NO. 5,343,053, 1994, a zener diode was inserted into the lateral SCR device to lower the switching voltage of the SCR. However, inserting such a zener diode requires additional and costly process steps during fabrication of this device structure by a commercial CMOS process.

In another two references [15]–[16],

[15] K. L. Chen and R.H. Pang, "Electrostatic Discharge Protection for Semiconductor Input Devices", U.S. Pat. No. 5,077,591, 1991, and

[16] K. D. Chen and R. H. Pang, "Method to Making Electrostatic Discharge Protection for Semiconductor Input Devices", U.S. Pat. No. 5,166,089, 1992, a separated vertical P-N-P bipolar transistor was placed adjacent to a lateral SCR device and used to trigger the lateral SCR device. However, this bipolar-trigger lateral SCR device also needs secondary protection elements to complete its ESD protection function.

In yet other references [17]–[22], a junction capacitance was used to lower the trigger voltage of lateral SCR devices under ESD-stress conditions. Lowering the trigger voltage due the added capacitance is possible, because the ESD event is essentially a pulse-like voltage that stresses the device. By the adding a capacitance, the pulse-mode trigger voltage of the lateral SCR device can be efficiently lowered to below the gate-oxide breakdown voltage. However, a precise capacitance value is difficult to obtain, control and duplicate in different CMOS processes.

In the references [17] and [18] listed below, there are two lateral SCR structures used in the input ESD protection circuit. In the references [19]–[22] listed below, there are four lateral SCR structures used in the input ESD protection circuit to one-by-one protect against the four-mode ESD stresses.

In the references [17]–[22], a capacitance-couple effect triggers on the lateral SCR devices during an ESD voltage transition. A thick-oxide (or often referred to as a field-oxide) device is used to help the turn-on speed of each lateral SCR structure discussed in the references [17]–[22]. A suitable capacitance in each lateral SCR structure needs to be precisely designed to perform proper ESD protection. However, a precise capacitance value may under certain circumstances not be easily obtained in different CMOS processes. Therefore, the ESD protection circuits discussed in the references [17]–[22] may be difficult to use in some cases in different CMOS technologies before experimental test chips are verified in each CMOS process.

The references [17]–[22] are

[17] C. -Y. Wu, M. -D. Ker, C. -Y. Lee, and J. Ko, "A New On-chip ESD Protection Circuit With Dual Parasitic SCR Structures for CMOS VLSI", *IEEE Journal of Solid-State Circuits*, Vol. 27, No. 3, pp. 274–280, 1992,

[18] M. -D. Ker, C. -Y. Lee, C. -Y. Wu, and J. Ko, "CMOS ESD Protection Circuit with Parasitic SCR Structures", U.S. Pat. No. 5,140,401, 1992,

[19] M. -D. Ker, C. -Y. Wu, and C. -Y. Lee, "A Novel CMOS ESD/EOS Protection Circuit with Full -SCR Structures", 1992 *EOS/ESD Symp. Proc.*, EOS-14, pp. 258–264,

[20] M. -D. Ker, C. -Y. Lee, and C. -Y. Wu, "CMOS On-Chip ESD Protection Circuit and Semiconductor Structure", U.S. Pat. No. 5,182,220, 1993,

[21] M. -D. Ker and C. -Y. Wu, "CMOS On-Chip Electrostatic Discharge Protection Circuit Using Four-SCR Structures with Low ESD-Trigger Voltage", *Solid-State Electronics*, Vol. 37, No. 1, pp. 17–26, 1994, and

[22] M. -D. Ker and C. -Y. Wu, "CMOS On-Chip ESD Protection Circuit and Semiconductor Structure", U.S. Pat. No. 5,289,334, 1994.

In two other references [23]–[24], another modified structure of a lateral SCR device called as LVTSCR (Low-Voltage Trigger SCR) has been discussed. The two references [23]–[24] are:

[23] A. Chatterjee and T. Polgreen, "A Low-Voltage Triggering SCR for On-Chip ESD Protection at Output and Input Pads", *IEEE Electron Device Letters*, vol. 12, no. 1, pp. 21–22, Jan. 1991, and

[24] A. Chatterjee and T. Polgreen, "A Low-Voltage Triggering SCR for On-Chip ESD Protection at Output and Input Pads", 1990 *Proc. Symposium on VLSI Technology*, pp. 75–76.

FIG. 2 shows the LVTSCR device 200 connected between an input pad 205 and a CMOS input stage 210 which is to be protected from ESD. The input pad 205 (or an output pad) is connected to the anode 215 of the LVTSCR device 200. The LVTSCR device 200 is made by inserting a short-channel NMOS device 220 into the lateral SCR device.

The lateral SCR device is a P-N-P-N lateral SCR where its anode is a P+ region 215 which acts as the first P region of the P-N-P-N lateral SCR device. The P+ region 215 is diffused in an N-well 225 which acts as the first N region of the P-N-P-N lateral SCR device. The P-substrate 230 acts as the second P region while another N+ region 235, which is diffused in the P-substrate 230, acts as the second N region of the P-N-P-N lateral SCR device. The N+ region 235 acts as the cathode of lateral SCR device.

The short-channel NMOS device 220 has a drain 240 which is diffused across a junction edge between the N-well 225 and the P-substrate 230. The N+ region 235 acts as the source of the short-channel NMOS device 220. A gate 245 of the short-channel NMOS device 220 is formed on the P-substrate 230 between the source 235 and the drain 240. The gate 245 is shorted to the source 235 and connected to ground.

The LVTSCR device has a trigger voltage which is lower than the gate-oxide breakdown voltage of the CMOS devices of the input stage 210. As a high voltage occurs at the anode 215 of the LVTSCR device 200, this high voltage is diverted to the drain 240 of the short-channel NMOS device 220.

In the short-channel NMOS device 220, the snapback breakdown voltage from the drain 240 to the source 235 is generally lower than its gate-oxide breakdown voltage. In the snapback breakdown condition, the short-channel NMOS device 220 causes current to flow from the N-well 225 to the P-substrate 230. The N-well to P-substrate junction is reverse biased. Therefore, the short-channel NMOS device 220 leads to a self-regeneration turn-on action of the lateral SCR device.

After the turn-on action, the LVTSCR device can alone provide ESD protection function without additional secondary protection elements. However, the LVTSCR device reported in references [23] and [24] does not offer ESD current discharging paths from the input pad to VDD. Therefore, the devices of the internal circuits between the input pad and the VDD bus are susceptible to ESD stresses.

Since the ESD voltages at a pin may have positive or negative polarities with respect to both VDD and VSS (ground) pins, there are four different ESD stress modes at each input or output pin:

(1) PS mode: ESD stress at a pin with positive voltage polarity with respect to the VSS(GND) pin when the VDD pin is floating;

(2) NS mode: ESD stress at a pin with negative voltage polarity with respect to the VSS(GND) pin when the VDD pin is floating;

(3) PD mode: ESD stress at a pin with positive voltage polarity with respect to the VDD pin when the VSS-(GND) pin is floating;

(4) ND mode: ESD stress at a pin with negative voltage polarity with respect to the VDD pin when the VSS-(GND) pin is floating.

These ESD voltages and currents could damage both the NMOS and PMOS devices in the input stage or the output buffer of CMOS ICs. FIG. 3 shows a CMOS input stage 210 to be protected against excessive high voltages (see also FIG. 2).

Illustratively, the input stage 210 includes a thin-oxide PMOS device P1 and a thin-oxide NMOS device N1. The source 315 of the PMOS device P1 is connected to a VDD bus and its drain 325 is connected to the drain 330 of the NMOS device N1. The source 335 of the NMOS device N1 is connected to a VSS bus which is normally grounded. The gates 345, 350 of the PMOS and NMOS devices P1, N1 are connected together to form an input 355 of the input stage 210. This input 355 is connected to the output of an ESD protection circuit. The output of the input stage 210 is formed by the common drain connection 360. Depending on the signal applied to the input 355 of the input stage 210, the output 360 of the input stage 210 is pulled up to VDD or pulled down to VSS.

In the references [3]–[16] and [23]–[24] cited above, there is only one lateral SCR device in the ESD protection circuit. This lateral SCR device is arranged between the input (or output) pad and the VSS(GND). Thus, it provides a direct ESD path only to the VSS bus which only protects against the PS and NS ESD stress modes. There is no ESD protection element arranged between the pad (input or output) and VDD.

FIG. 4 shows a block diagram of such an arrangement, where an ESD protection circuit 410 is connected between the input pad 205 and the input stage 210.

For the PD-mode or the ND-mode, where VSS is floating, the ESD current/voltage is first diverted from the input pin 420 to the VSS power line of the CMOS IC through the pad-to-VSS ESD protection circuit 410. This ESD current/voltage flows along the VSS power line which is connected to internal circuits 430 of the CMOS IC chip. The VSS power line or bus surrounds the whole CMOS IC chip.

At some point, this ESD current/voltage flows from the VSS power line to the VDD power line through either added VDD-to-VSS ESD protection elements or through other devices connected between the VDD and VSS power lines. Now, the ESD current/voltage flows along the VDD power line to a VDD pad connected to the VDD bus which is relatively grounded. Finally, this ESD current/voltage goes out of the CMOS IC chip from the VDD pin.

Due to the parasitic resistance and capacitance along the VSS/VDD power lines in the CMOS IC chip, as well as the voltage drops on the pad-to-VSS and VDD-to-VSS ESD protection elements, such a non-direct ESD discharging path causes unexpected ESD damage to the input stage 210 and the internal circuits 430. Therefore, without a direct ESD discharging path from the pad 205 to the VDD bus, the ESD protection circuit 410 cannot fully protect the input stage 210 and the internal circuits 430. Unexpected ESD damage occurs especially if the die size of the whole IC chip is large. This problem is discussed in the following references:

[25] C. Duvvury, R. N. Rountree, and O. Adams, "Internal Chip ESD Phenomena Beyond the Protection Circuit", *IEEE Trans. on Electron Devices*, vol. 35, no. 12, pp. 2133–2139, Dec., 1988,

[26] X. Guggenmos and R. Holzner, "A New ESD Protection Concept for VLSI CMOS Circuits Avoiding Circuit Stress", 1991 *EOS/ESD Symp. Proc.*, EOS-13, pp. 74–82,

[27] H. Terletzki, W. Nikutta, and W. Reczek, "Influence of the Series Resistance of On-Chip Power Supply Buses on Internal Device Failure after ESD Stress", *IEEE Trans. on Electron Devices*, vol. 40, no. 11, pp. 2081–2083, Nov., 1993, and

[28] C. Johnson, T. J. Maloney, and S. Qawami, "Two Unusual HBM ESD Failure Mechanisms on a Mature CMOS Process", 1993 EOS/ESD Symp. Proc., EOS-15, pp. 225–231.

It is the object of the present invention to provide an ESD protection circuit which provides a full protection for submicron CMOS technology by providing direct ESD discharging paths from the input and output pads to both the VDD and VSS power lines.

It is another object of the present invention to lower the turn-on voltage of a lateral SCR and to trigger on the lateral SCR by the inserted short-channel NMOS or PMOS devices at the snapback breakdown condition.

It is yet another object of the present invention to provide a robust ESD protection circuit which has sufficient ESD current discharging paths to shunt large ESD currents.

Another object of the present invention is to reduce the layout area needed for the ESD protection circuits thus reducing the size and cost of the IC chips and increasing packing density.

A further object of the present invention is to provide such an ESD protection without adversely affecting the operation of the internal circuits which are being protected, such as maintaining reliability and speed of operation of the internal circuits. Another object is to provide a voltage clamping effect on the input signals provided to the internal circuits to be protected.

SUMMARY OF THE INVENTION

The inventive ESD protection circuit overcomes the problem associated with non-direct ESD discharging paths while employing the advantage of high ESD protection capability of lateral SCR devices. The inventive ESD protection circuit provides full ESD protection for submicron CMOS technology within a small layout area.

In a preferred embodiment, the inventive four-LVTSCR ESD protection circuit comprises two EMOS trigger lateral SCR (PTLSCR) devices and two NMOS trigger lateral SCR (NTLSCR) devices. The PTLSCR and NTLSCR devices are connected to one-by-one protect against the four modes of ESD stresses and to avoid unexpected ESD damage to the input stage or the internal circuits.

The two PTLSCRs (PTLSCR1 and PTLSCR2) are connected between VDD and a pad (input or output) to protect against PD-mode and ND-mode ESD stresses respectively. The two NTLSCRs (NTLSCR1 and NTLSCR2) are connected between the pad and VSS to protect against PS-mode and NS-mode ESD stresses respectively.

The PTLSCR1, PTLSCR2 devices are each formed by inserting a short-channel thin-oxide PMOS device into a lateral SCR structure. The NTLSCR1, NTLSCR2 devices are each formed by inserting a short-channel thin-oxide NMOS device into a lateral SCR. These short-channel thin-oxide PMOS and NMOS devices are arranged to trigger on the lateral SCR structures during ESD stress. Thus, instead of the original switching voltages of the lateral SCR, the trigger voltages of the PTLSCR and NTLSCR devices are lowered below the gate-oxide breakdown voltages of the short-channel thin-oxide PMOS and NMOS devices in the input stage of submicron CMOS ICs.

The inventive four-LVTSCR ESD protection circuit can be realized in any CMOS or BiCMOS technology with N-well/P-substrate, P-well/N-substrate or twin well processes. The inventive circuit is fully process compatible with CMOS and BiCMOS technologies.

The inventive four-LVTSCR ESD protection circuit greatly improves the ESD performance of submicron CMOS ICs without the need for additional secondary protection elements. The inventive circuit fully protects the entire chip and eliminates unexpected ESD damages to the input stage or the internal circuits.

The inventive four-LVTSCR ESD protection circuit fully protects the input stage of CMOS integrated circuits from four different ESD stress modes by providing four different ESD direct discharging paths. In addition, the inventive circuit has a high ESD failure threshold and provides a robust ESD protection circuit, thus protecting against large ESDs, while occupying only a small layout area.

BRIEF DESCRIPTION OF THE DRAWINGS

FIG. 1b shows the semiconductor regions of the lateral SCR device of FIG. 1a.

FIG. 1c shows the I–V characteristic of the lateral SCR device of FIG. 1a.

DETAILED DESCRIPTION OF PREFERRED EMBODIMENTS OF THE INVENTION

A. Description of the Inventive Circuit

Figure 5:
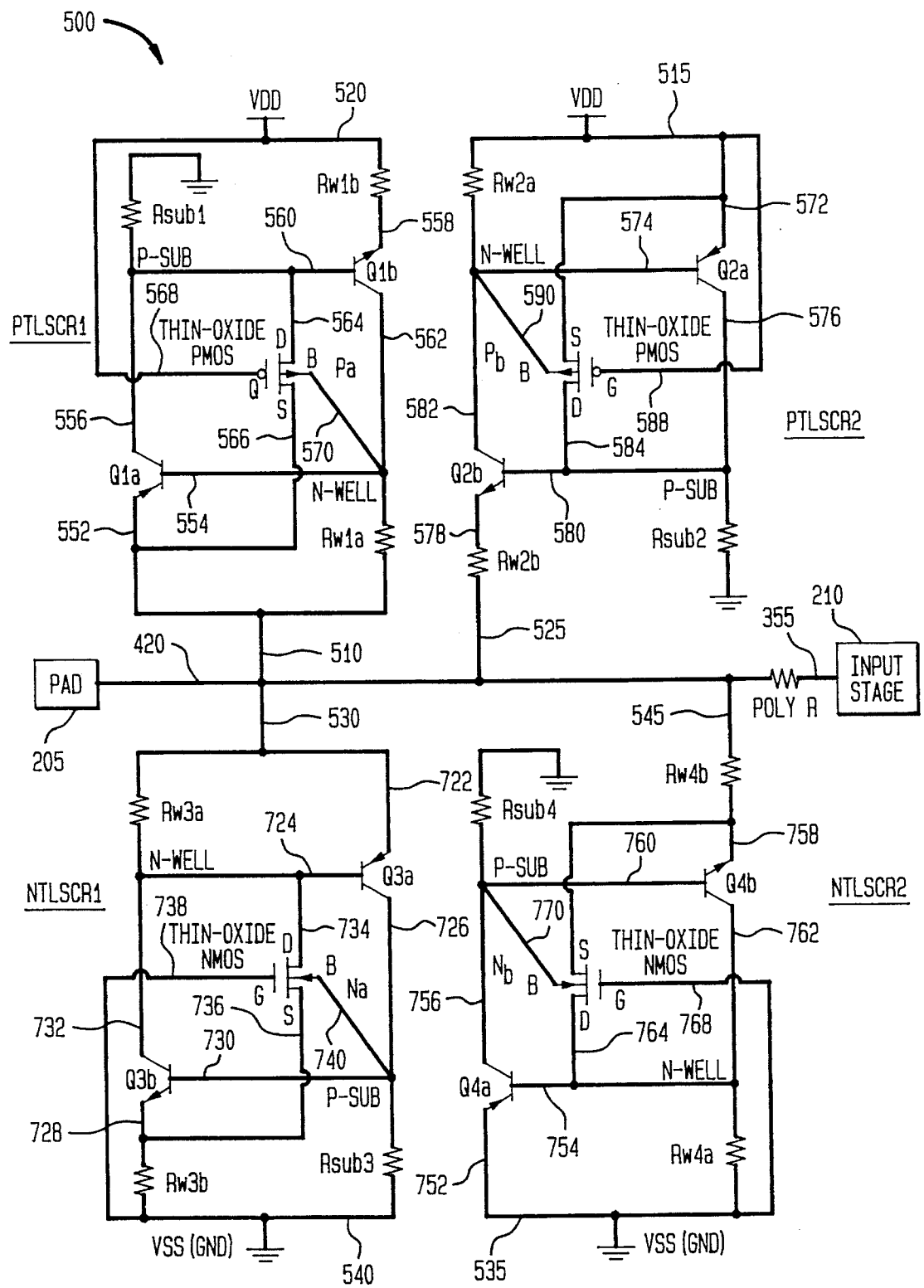
FIG. 5 shows an ESD protection circuit according to the present invention including PTLSCR1, PTLSCR2, NTLSCR1 and NTLSCR2 devices in N-well/P-substrate CMOS technology.

FIG. 5 shows a schematic diagram of a four-LVTSCR ESD protection circuit 500 according to an illustrative embodiment of the present invention. The inventive circuit is formed integrally with a CMOS IC, for example, and provides ESD protection for the CMOS IC. The ESD protection circuit 500 is connected between the pad (input or output pad) 205 and the input stage 210 of a CMOS IC. The input stage 210 is shown in greater detail in FIG. 3.

The inventive four-LVTSCR ESD protection circuit comprises two PMOS trigger lateral SCR PTLSCR1 and PTLSCR2 devices and two NMOS trigger lateral SCR NTLSCR1 and NTLSCR2 devices. The PTLSCR1 and PTLSCR2 devices are connected between VDD and the terminal 420 of the pad 205.

The NTLSCR1 and NTLSCR2 devices are connected between the terminal 420 of the pad 205 and VSS. A resistor R is connected in series along the signal path between the terminal 420 of the pad 205 and the terminal 355 of the input stage 210. An input signal is applied from the pad 205 to the terminal 355 of the input stage 210 through the resistor R. The resistor R is preferably a polysilicon resistor (i.e. a resistor formed from polysilicon). In addition to providing a path for input signals to reach the input stage 210, the poly resistor R is also used as a buffer to delay the ESD voltage to the input stage 210 before the ESD protection circuit 500 turns on to bypass ESD currents.

The four LVTSCR devices (PTLSCR1, PTLSCR2, NTLSCR1 and NTLSCR2) are used to bypass positive and negative undesired pulses or ESDs to both the VDD and the VSS buses.

As shown in FIG. 5, the PTLSCR1 device is arranged to bypass PD ESD stress mode while the PTLSCR2 device is arranged to bypass ND ESD stress mode. The NTLSCR1 device is arranged to bypass PS ESD stress mode and the NTLSCR2 device is arranged to bypass NS ESD stress mode. Thus, the four modes of ESD stresses on an input pin are one-by-one protected by the four LVTSCR devices. This offers efficient and direct ESD discharging paths to quickly bypass ESD currents. Therefore, the ESD protection circuit 500 performs full ESD protection for the input pin eliminating any unexpected ESD damage to the input stage which plagued conventional ESD circuits as reported in the references [25]–[28] cited above.

B. Description of the Inventive Circuit Realized in N-Well/P-Substrate CMOS Structure 1. Description of the PTLSCR1

As shown in FIG. 5, the PTLSCR1 device is arranged between the pad 205 and the VDD power line with its anode 510 connected to the pad 205 and its cathode 520 connected to VDD. The PTLSCR1 device comprises two bipolar junction transistors (BJTs) Q1a and Q1b and a short-channel thin-oxide PMOS device Pa. The two BJTs Q1a and Q1b form a lateral SCR1 device, while the thin-oxide PMOS Pa device lowers the trigger voltage of the lateral SCR1 device.

Q1a is a PNP BJT having an emitter 552 connected to the terminal 420 of the pad 205. The base 554 of Q1a is connected to a resistor Rw1a. The other terminal of the resistor Rw1a is connected to the terminal 420 of the pad 205. The collector 556 of Q1a is grounded through a resistor Rsub1.

Q1b is an NPN BJT having an emitter 558 connected to VDD through a resistor Rw1b. The base 560 of Q1b is connected to the collector 556 of Q1a. The collector 562 of Q1b is connected to the base 554 of Q1a.

pa is a short-channel thin-oxide PMOS device having a drain 564 connected to the base 560 of Q1b and a source 566 connected to the emitter 552 of Q1a. The gate 568 of the Pa is connected to VDD. The bulk 570 of Pa is connected to the base 554 of Q1a.

2. Description of the Layout of PTLSCR1

Figure 6:
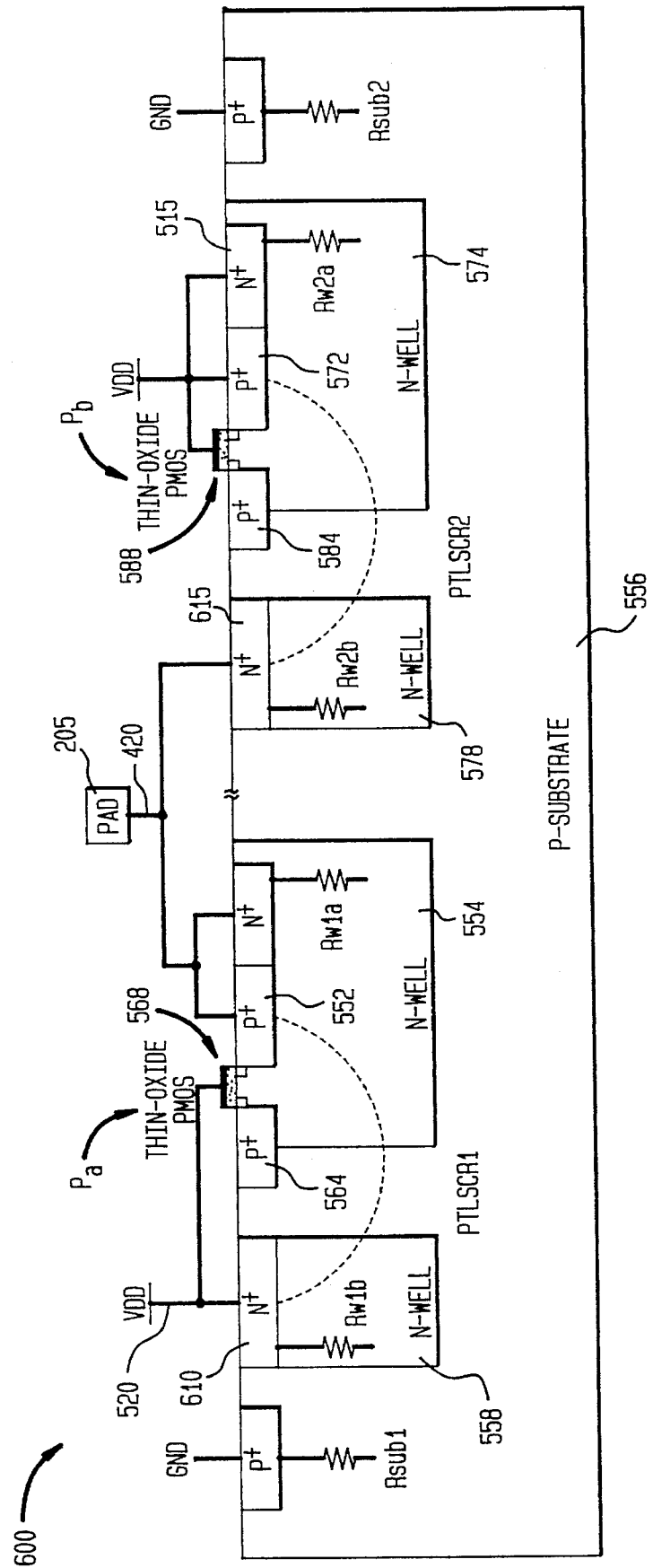
FIG. 6 shows a cross sectional view of the PTLSCR1 and PTLSCR2 devices shown in FIG. 5 formed in an N-well/P-substrate CMOS structure.

FIG. 6 shows a structure 600 which is a cross-sectional view of the PTLSCR1 and PTLSCR2 devices shown in FIG. 5, where a P-substrate/N-well CMOS structure is used as an illustrative example. The following description relates the structure 600 of FIG. 6 to the circuit diagram 500 of FIG. 5.

The PTLSCR1 device is formed by the lateral SCR1 device (comprised by the BJT's Q1a and Q1b) and the short-channel thin-oxide PMOS Pa device which is merged with the lateral SCR1 to lower the trigger voltage of the lateral SCR1 device.

Q1a is a parasitic vertical P-N-P bipolar junction transistor. Q1a is formed by a P+ diffusion 552 (acting as its emitter 552) in an N-well 554 (acting as its base 554). The P-substrate 556 acts as its collector 556.

Q1b is a parasitic lateral N-P-N bipolar junction transistor. Q1b is formed by an N+ diffusion 610 in another N-well 558. The N-well 558 acts as the emitter 558 of Q1b. The P-substrate 556 acts as the base 560 of Q1b and the N-well 554 acts as its collector 562.

The thin-oxide PMOS Pa device is formed by diffusing the P+ region 552 into the N-well 554. The P+ region 552 acts as the source 566 of the PMOS Pa. Another P+ region 564, which crosses the junction between the N-well 554 and the P-substrate 556, is diffused into both the N-well 554 and the P-substrate 556. The P+ region 564 acts as the drain 564 of the PMOS Pa. The N-well 554 acts as the bulk 570 of the PMOS Pa. The gate 568 of the thin-oxide PMOS Pa is connected to VDD. This ensures that the PMOS Pa is off during normal operating conditions of the CMOS IC.

The turn-on voltage of the PTLSCR1 device is not the original switching voltage (about 30–50V) of the lateral SCR1 device. Instead, the turn-on voltage of the PTLSCR1 device is equal to the turn-on voltage of the short-channel thin-oxide PMOS Pa, which is about VDD+|Vthp|Volts in 0.8 μm CMOS technology, where Vthp is the threshold voltage of the short channel thin-oxide PMOS Pa. Thus, the lateral SCR1 is triggered on by the PMOS Pa device at about VDD+|Vthp|Volts instead of being triggered on at about 30 to 50 volts in the PD-mode of ESD stress.

After turn-on, the holding voltage of the PTLSCR1 device is the same as the original holding voltage (about 1V) of the lateral SCR1 device. Similarly, the turn-on resistance of the PTLSCR1 device is the same as the original turn-on resistance of the lateral SCR1 device. The turn-on resistance is very low (about 2 to 5Ω) and is used to bypass ESD currents.

Rw1a and Rw1b are the inherent parasitic resistances of the N-wells 554 and 558 respectively. Rsub1 is the inherent parasitic resistance of the P-substrate 556. These resistances are shown in the structure of the PTLSCR1 (FIG. 6) and its equivalent circuit (FIG. 5).

3. Description of the PTLSCR2

Returning to FIG. 5, the PTLSCR2 device is arranged between VDD and the pad 205 with its anode 515 connected to VDD. The cathode 525 of the PTLSCR2 device is connected to the pad 205. The PTLSCR2 device comprises two bipolar junction transistors (BJTs) Q2a and Q2b and a short-channel thin-oxide PMOS device Pb. The two BJTs Q2a and Q2b form a lateral SCR2 device, while the thin-oxide PMOS Pb device lowers the trigger voltage of the lateral SCR2 device.

Q2a is a PNP BJT having an emitter 572 connected to VDD. The base 574 of Q2a is connected to a resistor Rw2a. The other terminal of the resistor Rw2a is connected to VDD. The collector 576 of Q2a is grounded through a resistor Rsub2.

Q2b is an NPN BJT having an emitter 578 connected to the terminal 420 of the pad 205 through a resistor Rw2b. The base 580 of Q2b is connected to the collector 576 of Q2a. The collector 582 of Q2b is connected to the base 574 of Q2a.

Pb is a short-channel thin-oxide PMOS device having a drain 584 connected to the base 580 of Q2b and a source 586 connected to the emitter 572 of Q2a. The gate 588 of the Pb is connected to VDD. The bulk 590 of Pb is connected to the base 574 of Q2a.

4. Description of the Layout of PTLSCR2

The following description relates the structure 600 of FIG. 6 to the circuit diagram 500 of FIG. 5. As shown in FIG. 6, the PTLSCR2 device is formed by the lateral SCR2 device (comprised by BJT's Q2a and Q2b) with the short-channel thin-oxide PMOS Pb device which is merged with the SCR2 to lower the trigger voltage of the lateral SCR2 device. The purpose of inserting a thin-oxide PMOS Pb into the lateral SCR2 structure is to trigger on the lateral SCR2 at the snapback breakdown voltage of the thin-oxide PMOS Pb during ESD stress.

Q2a is a parasitic vertical P-N-P bipolar junction transistor. Q2a is formed by a P+ diffusion 572 (acting as its emitter 572) in an N-well 574 (acting as its base 574). The P-substrate 556 acts as its collector 576.

Q2b is a parasitic lateral N-P-N bipolar junction transistor. Q2b is formed by an N+ diffusion 615 in another N-well 578. The N-well 578 acts as the emitter 578 of Q2b. The P-substrate 556 acts as the base 580 of Q2b and the N-well 574 acts as its collector 582.

The thin-oxide PMOS Pb device is formed by diffusing the P+ region 572 into the N-well 574. The P+ region 572 acts as the source 586 of the PMOS Pb device. Another P+ region 584, which crosses the junction between the N-well 574 and the P-substrate 556, is diffused into both the N-well 574 and the P-substrate 556. The P+ region 584 acts as the drain 584 of the PMOS Pb. The N-well 574 acts as the bulk 590 of the PMOS Pb. The gate 588 of the thin-oxide PMOS Pb is connected to VDD. This ensures that the PMOS Pb is off during normal operating conditions of the CMOS IC.

The turn-on voltage of the PTLSCR2 device is not the original switching voltage (about 30 V to 50 V) of the lateral SCR2 device. Instead, the turn-on voltage of the PTLSCR2 device is equal to the snapback breakdown voltage of the short-channel thin-oxide PMOS Pb, which is about −13 to −15 volts in 0.8 μm CMOS technology. Thus, the lateral SCR2 is triggered on by the PMOS Pb device at about −13 to −15 volts instead of being triggered on at about −30 to −50 volts in the ND-mode of ESD stress.

After turn-on, the holding voltage of the PTLSCR2 device is the same as the original holding voltage (about 1 V) of the lateral SCR2 device. Similarly, the turn-on resistance of the PTLSCR2 device is the same as the original turn-on resistance of the lateral SCR2 device. The turn-on resistance is very low (about 2 to 5 Ω) and is used to bypass ESD currents.

Rw2a and Rw2b are the inherent parasitic resistances of N-wells 574 and 578 respectively. Rsub 2 is the inherent parasitic resistance of the P-substrate 556. These resistances are shown in the structure of the PTLSCR2 (FIG. 6) and its equivalent circuit (FIG. 5).

Figure 7:
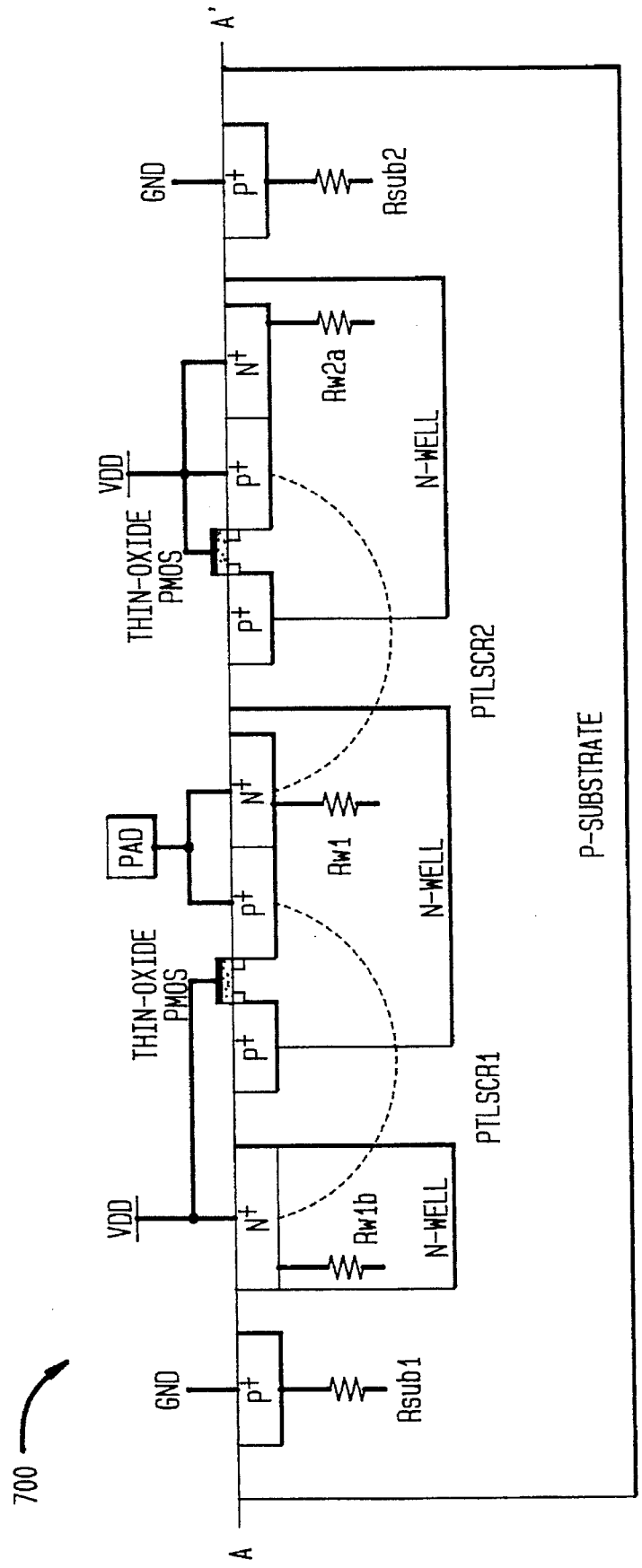
FIG. 7 shows a merged structure of the PTLSCR1 and PTLSCR2 shown in FIG. 6.

In FIG. 6, the two separated N-wells 554, 578 are both connected to the pad 205. The N-well 554 is used for the PTLSCR1 while the other N-well 578 is used for the PTLSCR2. FIG. 7 shows a merged structure 700 wherein these two N-wells 554, 578 are merged together to further reduce the layout area. The merged structure 700 of the PTLSCR1 and PTLSCR2 devices provides similar ESD protection as the structure 600 of FIG. 6, yet the merged structure 700 occupies a smaller layout area.

5. Description of the NTLSCR1

Returning to FIG. 5, the NTLSCR1 device is arranged between the pad 205 and the VSS power line with its anode 530 connected to the pad 205 and its cathode 540 connected to VSS which is normally grounded. The NTLSCR1 device comprises two bipolar junction transistors (BJTs) Q3a and Q3b and a short-channel thin-oxide NMOS device Na. The two BJTs Q3a and Q3b form a lateral SCR3 device, while the thin-oxide NMOS Na device lowers the trigger voltage of the lateral SCR3 device.

As shown FIG. 5, Q3a is a PNP BJT having an emitter 722 connected to the terminal 420 of the pad 205. The base 724 of Q3a is connected to a resistor Rw3a. The other terminal of the resistor Rw3a is connected to the terminal 420 of the pad 205. The collector 726 of Q3a is connected to the grounded VSS through a resistor Rsub3.

Q3b is an NPN BJT having an emitter 728 connected to the grounded VSS through a resistor Rw3b. The base 730 of Q3b is connected to the collector 726 of Q3a. The collector 732 of Q3b is connected to the base 724 of Q3a.

Na is a short-channel thin-oxide NMOS device having a drain 734 connected to the base 724 of Q3a and a source 736 connected to the emitter 728 of Q3b. The gate 738 of the Na is connected to the grounded VSS. The bulk 740 of Na is connected to the base 730 of 6. Description of the Layout of NTLSCR1

Figure 8:
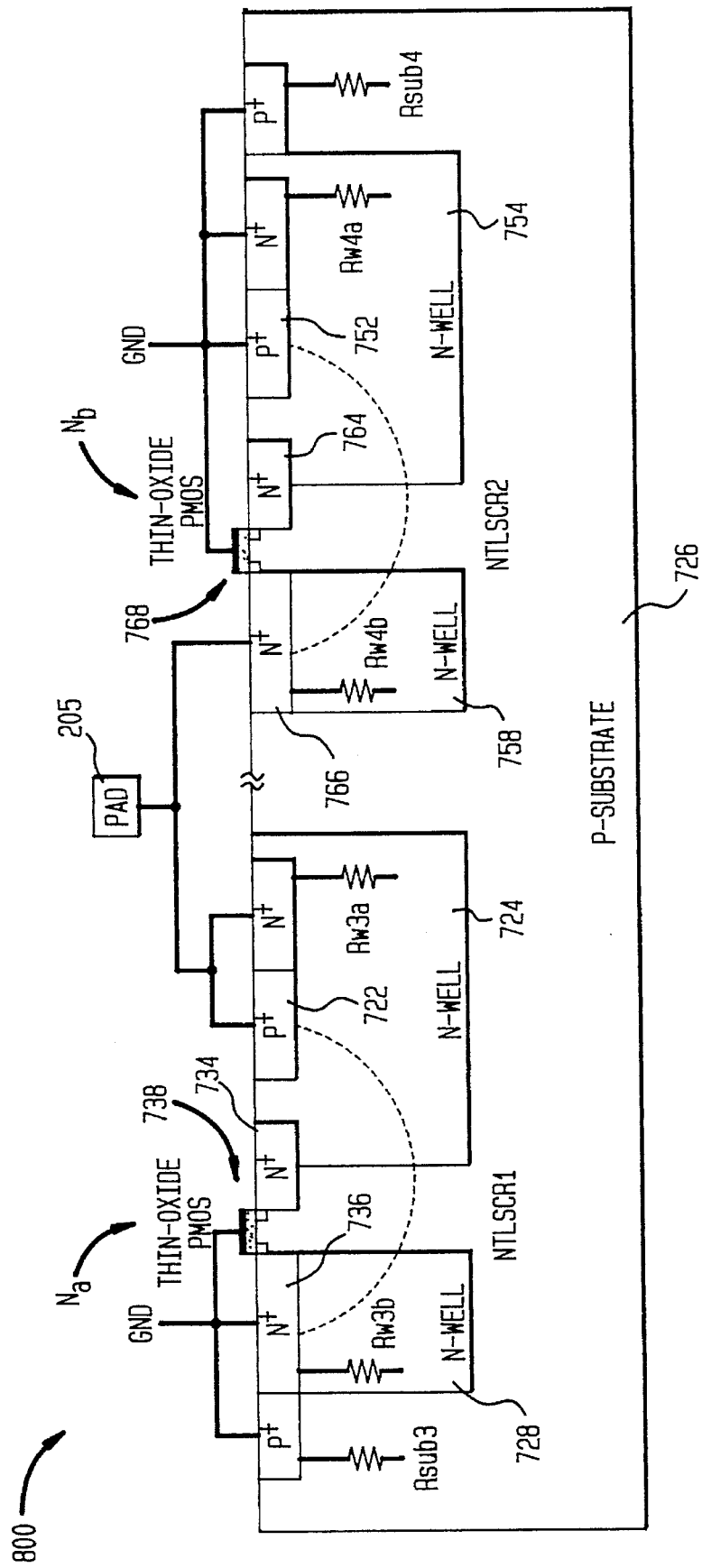
FIG. 8 shows a cross sectional view of the NTLSCR1 and NTLSCR2 devices shown in FIG. 5 formed in an N-well/P-substrate CMOS structure.

FIG. 8 shows a structure 800 which is a cross-sectional view of the NTLSCR1 and NTLSCR2 devices shown in FIG. 5, where a P-substrate/N-well CMOS structure is used as an illustrative example. The following description relates the structure 800 of FIG. 8 to the circuit diagram 500 of FIG. 5.

As shown in FIG. 8, the NTLSCR1 device is formed by the lateral SCR3 device (comprised by the BJT's Q3a and Q3b) with the short-channel thin-oxide NMOS Na device which is merged with the SCR3 to lower the trigger voltage of the lateral SCR3 device. The purpose of inserting a thin-oxide NMOS Na into the lateral SCR3 structure is to trigger on the lateral SCR3 at the snapback breakdown voltage of the thin-oxide NMOS Na during ESD stress.

Q3a is a parasitic vertical P-N-P bipolar junction transistor. Q3a is formed by a P+ diffusion 722 (acting as its emitter 722) in an N-well 724 (acting as its base 724). The P-substrate 726 acts as its collector 726.

Q3b is a parasitic lateral N-P-N bipolar junction transistor. Q3b is formed by an N+ diffusion 736 in another N-well 728. The N-well 728 acts as the emitter 728 of Q3b. The P-substrate 726 acts as the base 730 of Q3b and the N-well 724 acts as its collector 732.

The thin-oxide NMOS Na device is formed by diffusing the N+region 736 into the N-well 728. The N+ region 736 acts as the source 736 of the NMOS Na device. Another N+ region 734, which crosses the junction between the N-well 724 and the P-substrate 726, is diffused into both the N-well 724 and the P-substrate 726. The N+ region 734 acts as the drain 734 of the NMOS Na. The P-substrate 726 acts as the bulk 740 of the NMOS Na. Thus, the thin-oxide NMOS Na is made between the two adjacent N-wells 724, 728. The gate 738 of the thin-oxide NMOS Na is connected to the grounded VSS. This ensures that the NMOS Na is off during normal operating conditions of the CMOS IC.

The turn-on voltage of the NTLSCR1 device is not the original switching voltage (about 30 V to 50 V) of the lateral SCR3 device. Instead, the turn-on voltage of the NTLSCR1 device is equal to the snapback breakdown voltage of the short-channel thin-oxide NMOS Na, which is about 13 to 15 volts in 0.8 μm CMOS technology. Thus, the lateral SCR3 is triggered on by the NMOS Na device at about 13 to 15 volts instead of being triggered on at about 30 to 50 volts in the PS-mode of ESD stress.

After turn-on, the holding voltage of the NTLSCR1 device is the same as the original holding voltage (about 1 V) of the lateral SCR3 device. Similarly, the turn-on resistance of the NTLSCR1 device is the same as the original turn-on resistance of the lateral SCR3 device. The turn-on resistance is very low (about 2 to 5 Ω) and is used to bypass ESD currents.

Rw3a and Rw3b are the inherent parasitic resistances of the N-wells 724 and 728 respectively. Rsub3 is the inherent parasitic resistance of the P-substrate 726. These resistances are shown in the structure of the NTLSCR1 (FIG. 8) and its equivalent circuit (FIG. 5).

7. Description of the NTLSCR2

Returning to FIG. 5, the NTLSCR2 device is arranged between the pad 205 and the VSS power line with its cathode 545 connected to the pad 205 and its anode 535 connected to VSS which is normally grounded. The NTLSCR2 device comprises two bipolar junction transistors (BJTs) Q4a and Q4b and a short-channel thin-oxide NMOS device Nb. The two BJTs Q4a and Q4b form a lateral SCR4 device, while the thin-oxide NMOS Nb device lowers the trigger voltage of the lateral SCR4 device.

Q4a is a PNP BJT having an emitter 752 connected to the grounded VSS. The base 754 of Q4a is connected to a resistor Rw4a. The other terminal of the resistor Rw4a is connected to the grounded VSS. The collector 756 of Q4a is connected to the ground through a resistor Rsub4.

Q4b is an NPN BJT having an emitter 758 connected to the terminal 420 of the pad 205 through a resistor Rw4b. The base 760 of Q4b is connected to the collector 756 of Q4a. The collector 762 of Q4b is connected to the base 754 of Q4a.

Nb is a short-channel thin-oxide NMOS device having a drain 764 connected to the base 754 of Q4a and a source 766 connected to the emitter 758 of Q4b. The gate 768 of the Nb is connected to the grounded VSS. The bulk 770 of Na is connected to the base 760 of Q4b.

8. Description of the Layout of NTLSCR2

The following description relates the structure 800 of FIG. 8 to the circuit diagram 500 of FIG. 5. As shown in FIG. 8, the NTLSCR2 device is formed by the lateral SCR4 device (comprised by BJT's Q4a and Q4b) with the short-channel thin-oxide NMOS Nb device which is merged with the SCR4 to lower the trigger voltage of the lateral SCR4 device.

As shown in FIG. 8, Q4a is a parasitic vertical P-N-P bipolar junction transistor. Q4a is formed by a P+ diffusion 752 (acting as its emitter 752) in an N-well 754 (acting as its base 754). The P-substrate 726 acts as its collector 756.

Q4b is a parasitic lateral N-P-N bipolar junction transistor. Q4b is formed by an N+ diffusion 766 in another N-well 758. The N-well 758 acts as the emitter 758 of Q4b. The P-substrate 726 acts as the base 760 of Q4b and the N-well 754 acts as its collector 762.

The thin-oxide NMOS Nb device is formed by diffusing the N+ region 766 into the N-well 758. The N+ region 766 acts as the source 766 of the NMOS Nb device. Another N+ region 764, which crosses the junction between the N-well 754 and the P-substrate 726, is diffused into both the N-well 754 and the P-substrate 726. The N+ region 764 acts as the drain 764 of the NMOS Nb. The P-substrate 726 acts as the bulk 770 of the NMOS Nb. Thus, the thin-oxide NMOS Nb is made between the two adjacent N-wells 754, 758. The gate 768 of the thin-oxide NMOS Nb is connected to the grounded VSS. This ensures that the NMOS Nb is off during normal operating conditions of the CMOS IC.

The turn-on voltage of the NTLSCR2 device is not the original switching voltage (about 30–50 V) of the lateral SCR4 device. Instead, the turn-on voltage of the NTLSCR2 device is equal to the turn-on voltage of the short-channel thin-oxide NMOS Nb, which is about VSS-Vthn Volts in 0.8 μm CMOS technology, where Vthn is the threshold voltage of the thin-oxide NMOS Nb. Thus, the lateral SCR4 is triggered on by the NMOS Nb device at about VSS-Vthn Volts instead of being triggered on at about −30 to −50 volts in the NS-mode of ESD stress.

After turn-on, the holding voltage of the NTLSCR2 device is the same as the original holding voltage (about 1 V) of the lateral SCR4 device. Similarly, the turn-on resistance of the NTLSCR2 device is the same as the original turn-on resistance of the lateral SCR4 device. The turn-on resistance is very low (about 2 to 5Ω) and is used to bypass ESD currents.

Rw4a and Rw4b are the inherent parasitic resistances of the N-wells 754 and 758 respectively. Rsub4 is the inherent parasitic resistance of the P-substrate 726. These resistances are shown in the structure of the NTLSCR2 (FIG. 8) and its equivalent circuit (FIG. 5).

Figure 9:
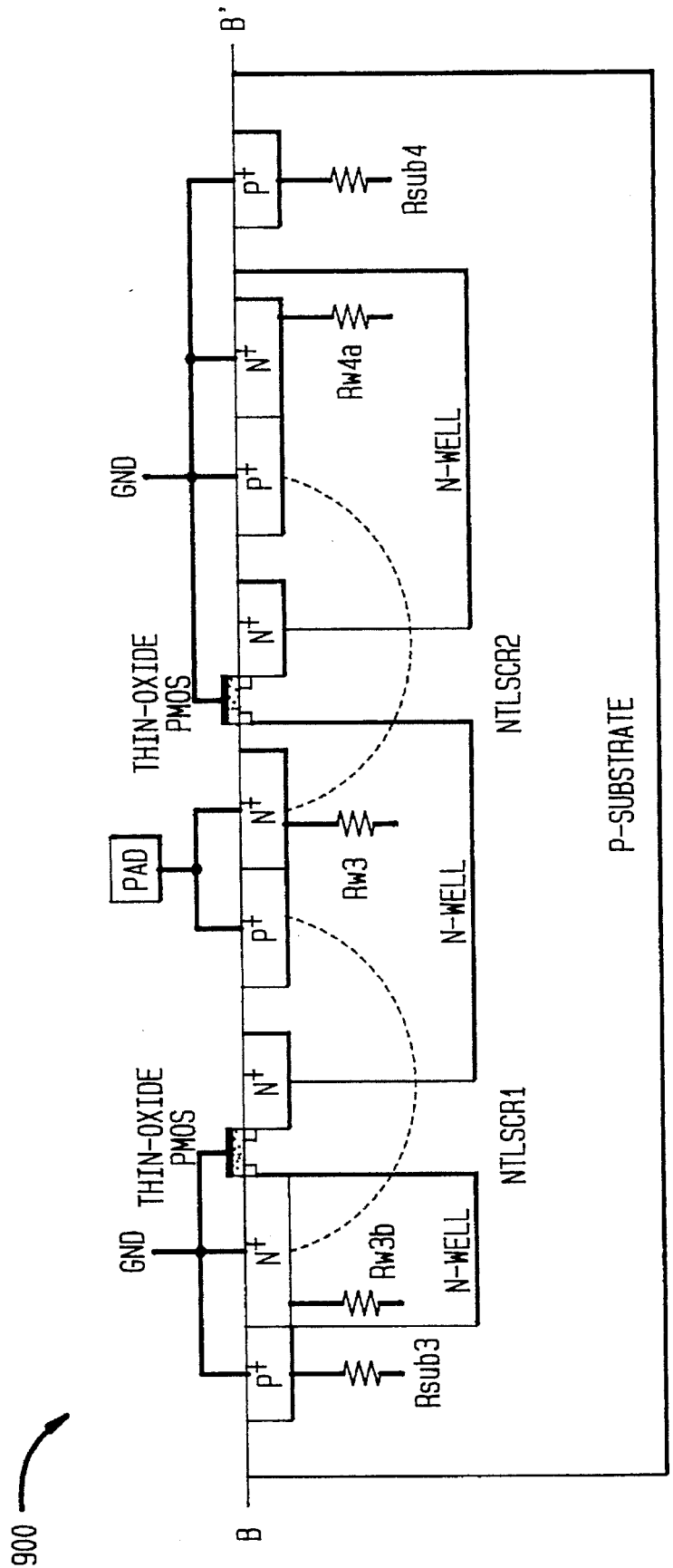
FIG. 9 shows a merged structure of the NTLSCR1 and NTLSCR2 shown in FIG. 8.

In FIG. 8, the two separated N-wells 724, 758 are both connected to the pad 205. The N-well 724 is used for the NTLSCR1 while the other N-well 758 is used for the NTLSCR2. FIG. 9 shows a merged structure 900 wherein these two N-wells 724, 758 are merged together to further reduce the layout area. The merged structure 900 of the NTLSCR1 and NTLSCR2 devices provides similar ESD protection as the structure 800 of FIG. 8, yet the merged structure 900 occupies a smaller layout area.

The turn-on voltage of the PTLSCR2 (NTLSCR1) device is equivalent to the snapback breakdown voltage of the short-channel PMOS Pb (NMOS Na) device. The snapback breakdown voltage of the PMOS (NMOS) device is about −13 V to −15 V (13 V to 15 V) in 0.8 μm CMOS technology. The turn-on voltage of the PTLSCR2 and NTLSCR1 devices is much lower than the original switching voltage of a lateral SCR device which is about 30 V to 50 V.

On the other hand, the turn-on voltage of the PTLSCR1 (NTLSCR2) device is equivalent to the turn-on voltage of the short-channel PMOS Pa (NMOS Nb) device. The turn-on voltage of the PMOS Pa (NMOS Nb) device is about VDD+|Vthp| (VSS-Vthn) in 0.8 μm CMOS technology. The turn-on voltage of the PTLSCR1 and NTLSCR2 devices is much lower than the original switching voltage of a lateral SCR device which is about 30 V to 50 V.

The snapback breakdown voltage of the short-channel thin-oxide PMOS Pb and NMOS Na devices is dependent on the CMOS technologies. Generally this snapback breakdown voltage is lower than the breakdown voltage of gate-oxide CMOS devices in the same CMOS technology. Thus, the PTLSCR and NTLSCR devices are turned on or triggered on at the low snapback breakdown voltages of the PMOS Pb and NMOS Na devices in the ND and PS modes of ESD stresses respectively. Therefore, the inventive four- LVTSCR circuit can alone protect CMOS input stages without additional secondary protection elements.

9. Layout Examples

Figure 10:
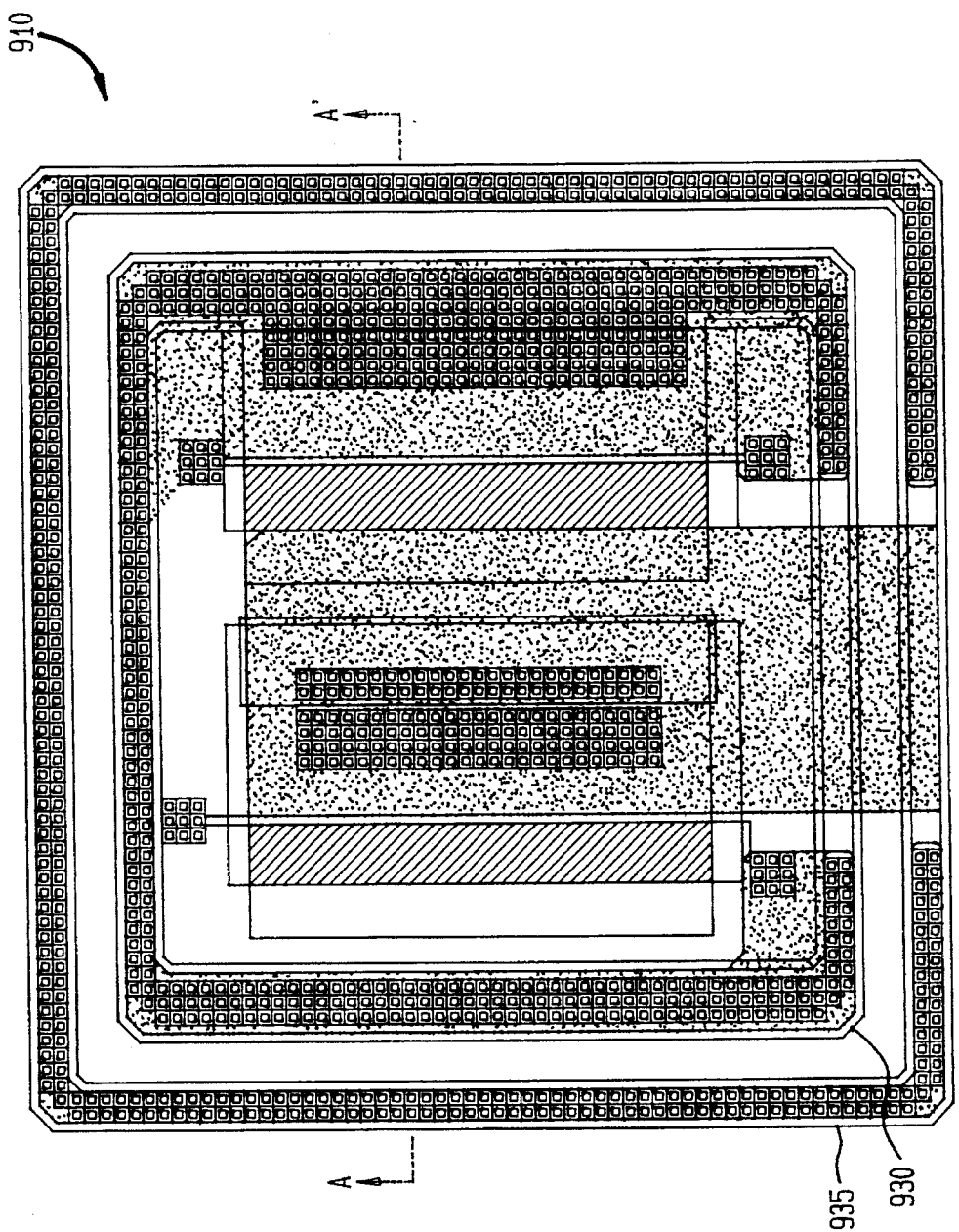
FIG. 10 shows a pattern layout of the merged structure of the PTLSCR1 and PTLSCR2 shown in FIG. 7 which is the cross sectional view along the line A—A'.
Figure 11:
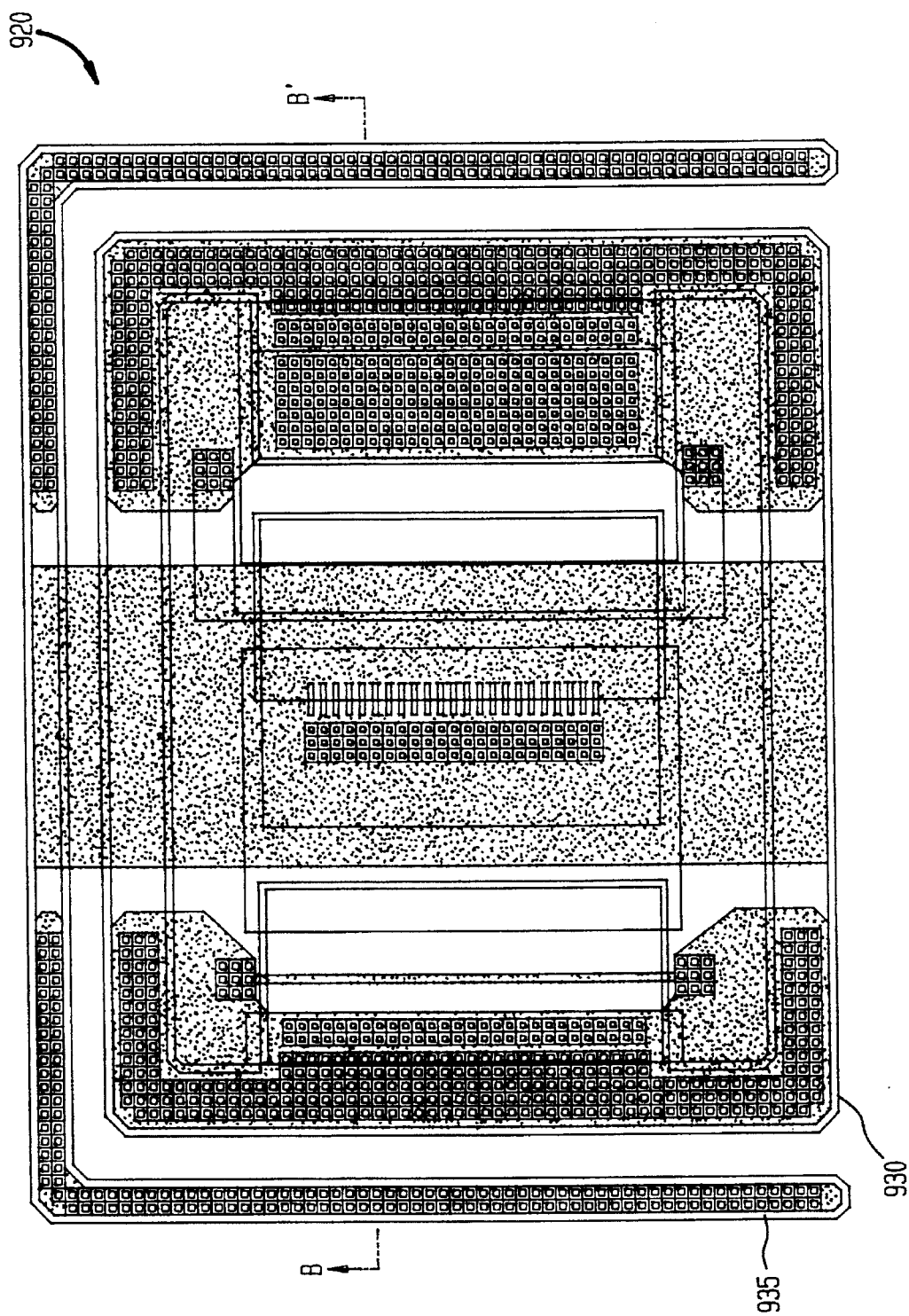
FIG. 11 shows a pattern layout of the merged structure of the NTLSCR1 and NTLSCR2 shown in FIG. 9 which is the cross sectional view along the line B—B'.

FIGS. 10 and 11 show an illustrative layout 910, 920 of the inventive ESD protection circuit 500 using a 0.6 μm twin-well/P-substrate CMOS technology. The layouts 910, 920 also show inner and outer guard rings 930, 935 around the inventive ESD protection circuit 500. The guard rings 930, 935 prevent VDD-to-VSS latchup.

FIG. 10 shows the layout for the merged structure 700 of the PTLSCR1 and PTLSCR2 devices, in which the line A—A' is used for the cross-sectional view shown in FIG. 7. FIG. 11 shows the layout for the merged structure 900 of the NTLSCR1 and NTLSCR2 devices, in which the line B—B' is used for the cross-sectional view shown in FIG. 9.

The layout style is not limited to these examples of FIGS. 10 and 11. Other layout styles can be also used to realized this invention.

Figure 12:
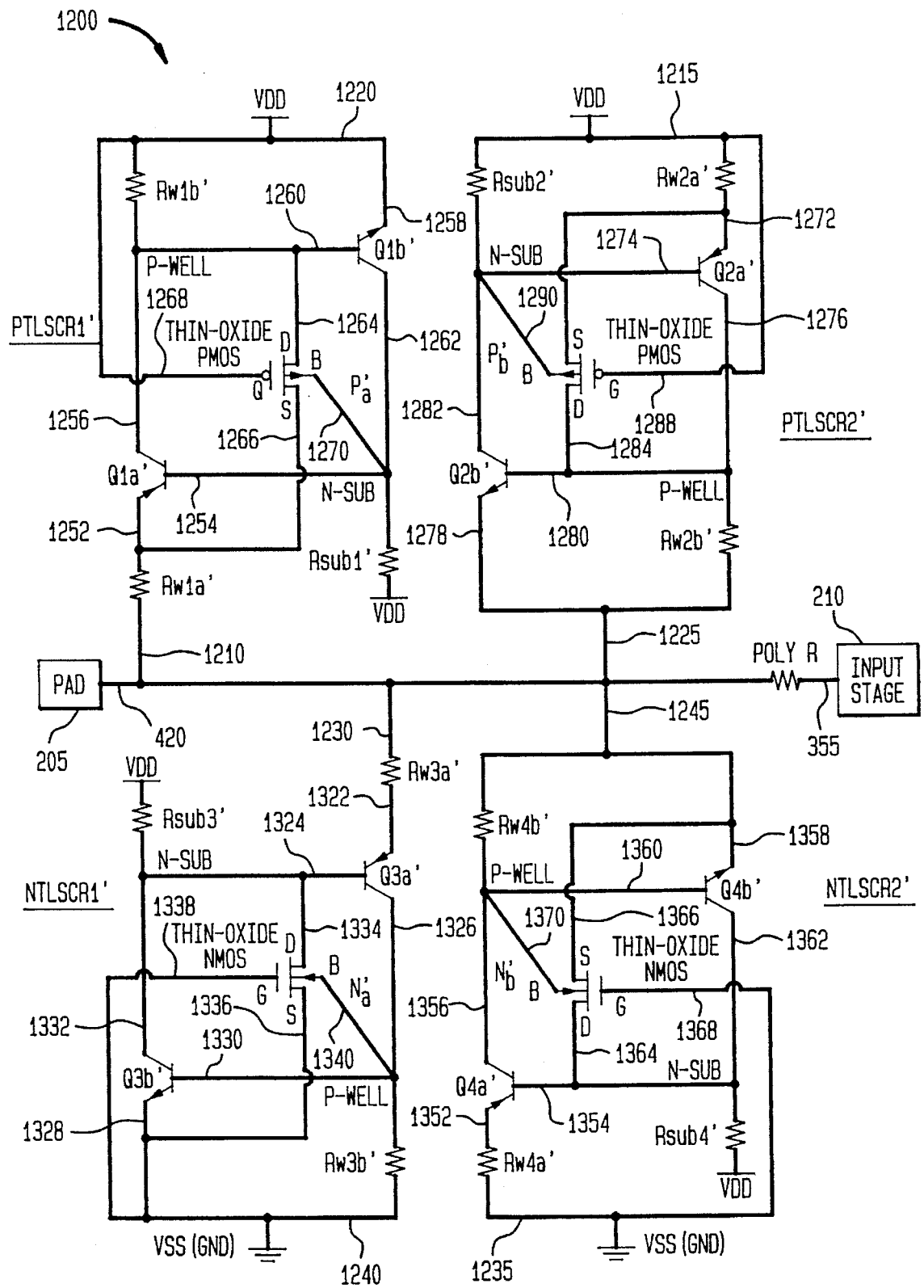
FIG. 12 shows an ESD protection circuit according to the present invention including PTLSCR1', PTLSCR2', NTLSCR1' and NTLSCR2' devices in P-well/N-substrate CMOS technology.
Figure 13:
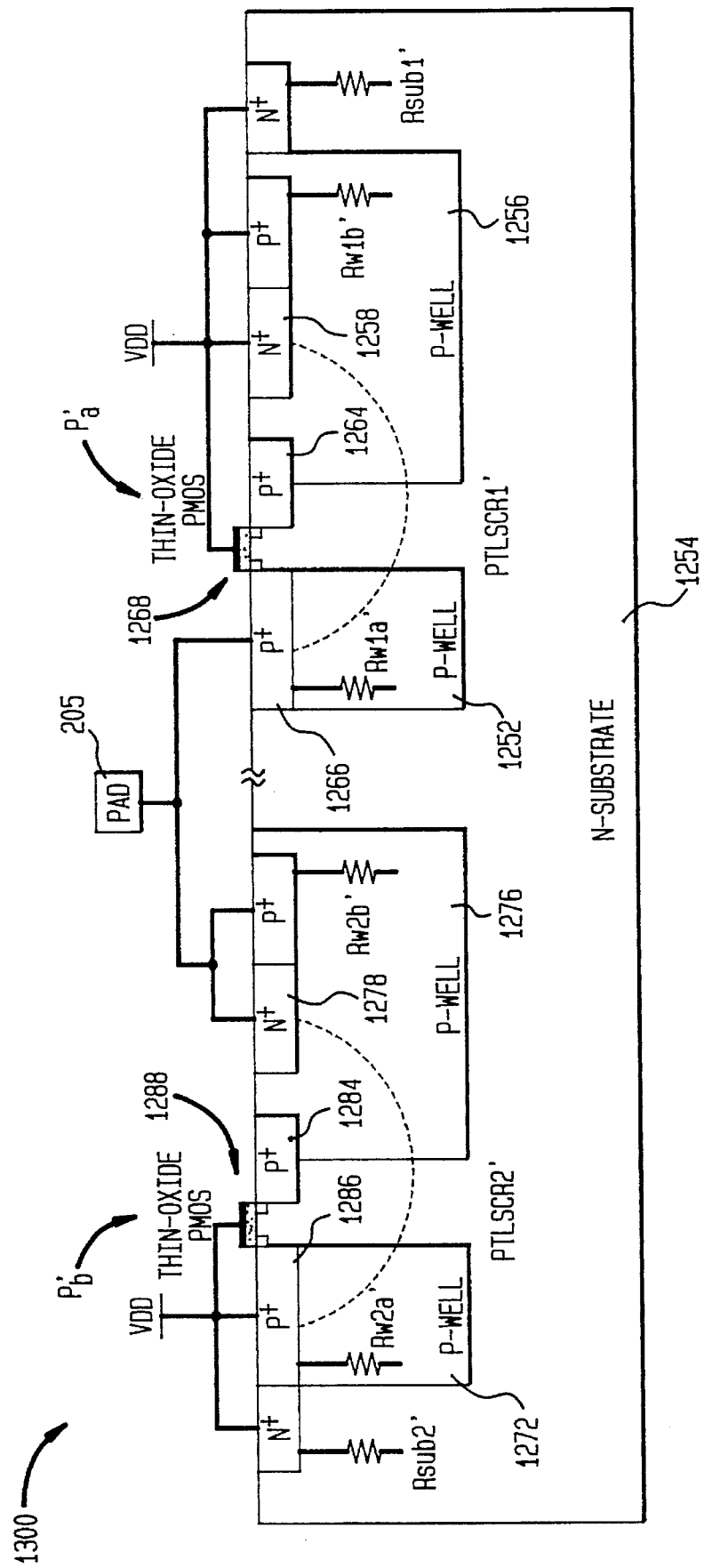
FIG. 13 shows a cross sectional view of the PTLSCR1' and PTLSCR2' devices shown in FIG. 12 formed in a P-well/N-substrate CMOS structure.
Figure 15:
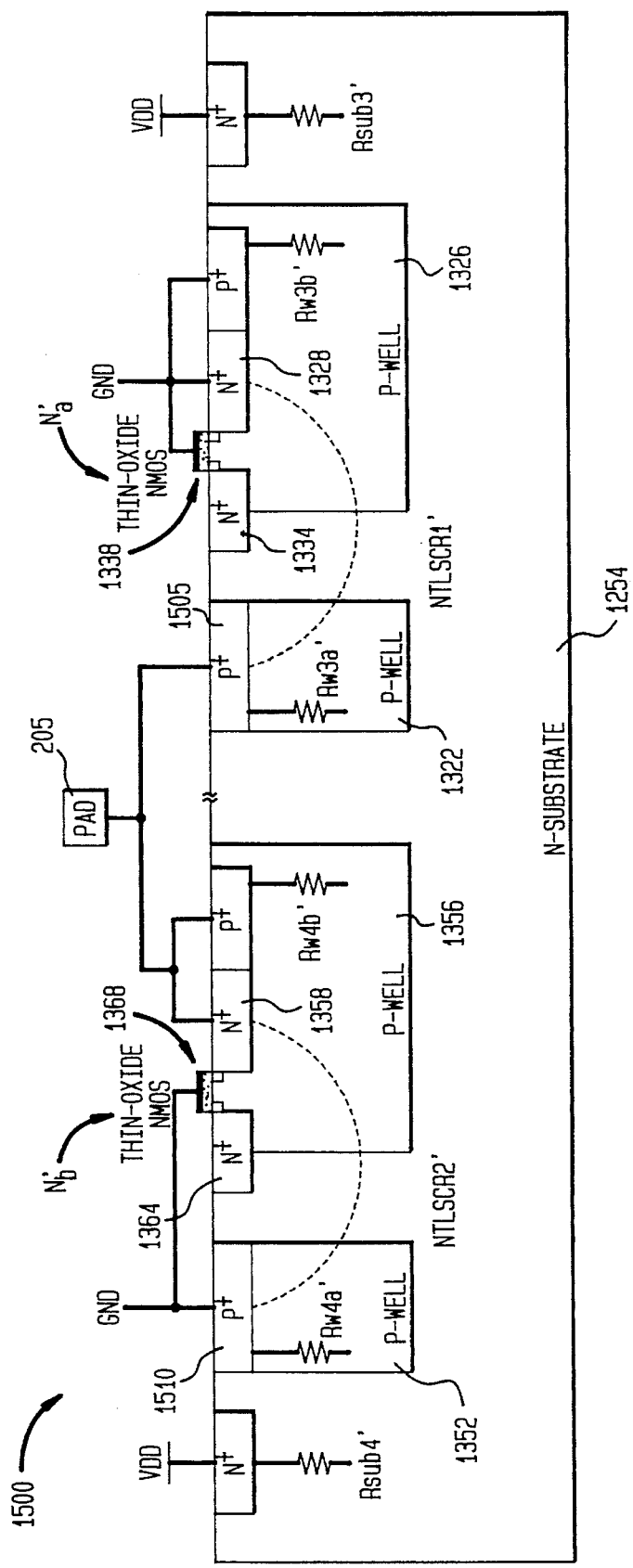
FIG. 15 shows a cross sectional view of the NTLSCR1' and NTLSCR2' devices shown in FIG. 12 formed in a P-well/N-substrate CMOS structure.

C. Description of the Inventive Circuit Realized in P-Well/N-Substrate CMOS Structure The PTLSCR1, PTLSCR2, NTLSCR1, and NTLSCR2 devices can be also realized by P-well/N-substrate CMOS technology. FIG. 12 shows the ESD protection circuit 1200 in the P-well/N-substrate CMOS structure. FIG. 12 comprises PTLSCR1', PTLSCR2', NTLSCR1' and NTLSCR2' devices. FIG. 13 shows the corresponding structure 1300 which is a cross-sectional view of the PTLSCR1' and PTLSCR2' devices of FIG. 12. Similarly, FIG. 15 shows the corresponding structure 1500 which is a cross-sectional view of the NTLSCR1' and NTLSCR2' devices of FIG. 12.

1. Description of the PTLSCR1'

As shown in FIG. 12, the PTLSCR1' device is arranged between the pad 205 and the VDD power line with its anode 1210 connected to the pad 205 and its cathode 1220 connected to VDD. The PTLSCR1 device comprises two bipolar junction transistors (BJTs) Q1a' and Q1b' and a short-channel thin-oxide PMOS device Pa'. The two BJTs Q1a' and Q1b' form a lateral SCR1' device, while the thin-oxide PMOS Pa' device lowers the trigger voltage of the lateral SCR1 device.

Q1a' is a PNP BJT having an emitter 1252 connected to the terminal 420 of the pad 205 through a resistor Rw1a'. The base 1254 of Q1a' is connected to the VDD through a resistor Rsub1'. The collector 1256 of Q1a' is connected to the VDD through a resistor Rw1b'.

Q1b' is an NPN BJT having an emitter 1258 connected to VDD and a base 1260 connected to the collector 1256 of Q1a' The collector 1262 of Q1b' is connected to the base 1254 of Q1a'

Pa' is a short-channel thin-oxide PMOS device having a drain 1264 connected to the base 1260 of Q1b' and a source 1266 connected to the emitter 1252 of Q1a' The gate 1268 of the Pa' is connected to VDD. The bulk 1270 of Pa' is connected to the base 1254 of Q1a'.

If the input voltage at the pad 205 is over the turn-on voltage of the PMOS Pa', (i.e., the turn-on voltage is greater than VDD+|Vthp|, where Vthp is the threshold voltage of the thin-oxide PMOS Pa'), then the PMOS Pa' will turn on and cause occurrence of latchup along the lateral SCR1' structure in PTLSCR1'.

2. Description of the Layout of PTLSCR1'

FIG. 13 shows the structure 1300 which is a cross-sectional view of the PTLSCR1' and PTLSCR2' devices shown in FIG. 12, where an P-well/N-substrate CMOS structure is used as an illustrative example. The following description relates the structure 1300 of FIG. 13 to the circuit diagram 1200 of FIG. 12.

The PTLSCR1' device is formed by the lateral SCR1' device (comprised by the BJT's Q1a' and Q1b') and the short-channel thin-oxide PMOS Pa' device which is merged with the lateral SCR1' to lower the trigger voltage of the lateral SCR1' device.

Q1a' is a parasitic lateral P-N-P bipolar junction transistor in the P-well/N-substrate CMOS structure. Q1a' is formed by a P+ diffusion 1266 (acting as the source of the PMOS Pa') in an P-well 1252 (acting as the emitter 1252 of Q1a'). The N-substrate 1254 acts as the base 1254 of Q1a'. Another adjacent P-well 1256 acts as the collector 1256 of Q1a'.

Q1b' is a parasitic vertical N-P-N bipolar junction transistor in the P-well/N-substrate CMOS structure. The emitter 1258 of Q1b' is formed by an N+ diffusion 1258 in the P-well 1256. The P-well 1256 acts as the base 1260 of Q1b'. The N-substrate 1254 acts as the collector 1262 of Q1b'.

The thin-oxide PMOS Pa' device is formed by diffusing the P+region 1266 into the P-well 1252. The P+ region 1266 acts as the source 1266 of the PMOS Pa' device. Another P+ region 1264, which crosses the junction between the P-well 1256 and the N-substrate 1254, is diffused into both the P-well 1256 and the N-substrate 1254. The P+ region 1264 acts as the drain 1264 of the PMOS Pa'. The N-substrate 1254 acts as the bulk 1270 of the PMOS Pa'. The gate 1268 of the thin-oxide PMOS Pa' is connected to VDD. This ensures that the PMOS Pa' is off during normal operating conditions of the CMOS IC.

As with the PTLSCR1 device of FIG. 5, the turn-on voltage of the PTLSCR1' device is not the original switching voltage (about 30 V to 50 V) of the lateral SCR1' device. Instead, the turn-on voltage of the PTLSCR1' device is equal to the turn-on voltage of the short-channel thin-oxide PMOS Pa', which is about VDD+|Vthp'| in 0.8 μm CMOS technology, where Vthp' is the threshold voltage of the short-channel thin-oxide PMOS Pa' Thus, the lateral SCR1' is triggered on by the PMOS Pa' device at about VDD+|Vthp'| volts instead of being triggered on at about 30 to 50 volts in the PD-mode of ESD stress.

After turn-on, the holding voltage of the PTLSCR1' device is the same as the original holding voltage (about 1 V) of the lateral SCR1' device. Similarly, the turn-on resistance of the PTLSCR1' device is the same as the original turn-on resistance of the lateral SCR1' device. The turn-on resistance is very low (about 2 to 5 Ω) and is used to bypass ESD currents.

Rw1a', and Rw1b' are the inherent parasitic resistances of the P-wells 1252 and 1256 respectively. Rsub1' is the inherent parasitic resistance of the N-substrate 1254. These resistances are shown in the structure 1300 of the PTLSCR1' (FIG. 13) and its equivalent circuit 1200 (FIG. 12).

3. Description of the PTLSCR2'

Returning to FIG. 12, the PTLSCR2' device is arranged between VDD and the pad 205 with its anode 1215 connected to VDD. The cathode 1225 of the PTLSCR2' device is connected to the pad 205. The PTLSCR2' device comprises two bipolar junction transistors (BJTs) Q2a' and Q2b' and a short-channel thin-oxide PMOS device Pb' The two BJTs Q2a' and Q2b' form a lateral SCR2' device, while the thin-oxide PMOS Pb' device lowers the trigger voltage of the lateral SCR2' device.

Q2a' is a PNP BJT having an emitter 1272 connected to VDD through a resistor Rw2a'. The base 1274 of Q2a' is connected to VDD through a resistor Rsub2'. The collector 1276 of Q2a' is connected to the terminal 420 of the pad 205 through a resistor Rw2b'.

Q2b' is an NPN BJT having an emitter 1278 connected to the terminal 420 of the pad 205. The base 1280 of Q2b' is connected to the collector 1276 of Q2a'. The collector 1282 of Q2b' is connected to the base 1274 of Q2a'.

Pb' is a short-channel thin-oxide PMOS device having a drain 1284 connected to the base 1280 of Q2b' and a source 1286 connected to the emitter 1272 of Q2a' The gate 1288 of Pb' is connected to VDD. The bulk 1290 of Pa' is connected to the base 1274 of Q2a'.

4. Description of the Layout of PTLSCR2'

The following description relates the structure 1300 of FIG. 13 to the circuit diagram 1200 of FIG. 12. As shown in FIG. 13, the PTLSCR2' device is formed by the lateral SCR2' device (comprised by BJT's Q2a' and Q2b') with the short-channel thin-oxide PMOS Pb' device which is merged with the lateral SCR2' to lower the trigger voltage of the lateral SCR2' device. The purpose of inserting a thin-oxide PM©S Pb' into the lateral SCR2' structure is to trigger on the lateral SCR2' at the snapback breakdown voltage of the thin-oxide PMOS Pb' during ESD stress.

Q2a' is a parasitic lateral P-N-P bipolar junction transistor in the P-well/N-substrate CMOS structure. Q2a' is formed by a P+ diffusion 1286 (acting as the source of the PMOS Pb') in an P-well 1272 (acting as the emitter 1272 of Q2a'). The N-substrate 1254 acts as the base 1274 of Q2a'. Another adjacent P-well 1276 acts as the collector 1276 of Q2a'.

Q2b' is a parasitic vertical N-P-N bipolar junction transistor in the P-well/N-substrate CMOS structure. The emitter 1278 of Q2b' is formed by an N+ diffusion 1278 in the P-well 1276. The P-well 1276 acts as the base 1280 of Q2b'. The N-substrate 1254 acts as the collector 1282 of Q2b'.

The thin-oxide PMOS Pb' device is formed by diffusing the P+ region 1286 into the P-well 1272. The P+ region 1286 acts as the source 1286 of the PMOS Pb' device. Another P+ region 1284, which crosses the junction between the P-well 1276 and the N-substrate 1254, is diffused into both the P-well 1276 and the N-substrate 1254. The P+ region 1284 acts as the drain 1284 of the PMOS Pb'. The N-substrate 1254 acts as the bulk 1290 of the PMOS Pb'. The gate 1288 of the thin-oxide PMOS Pb' is connected to VDD. This ensures that the PMOS Pb' is off during normal operating conditions of the CMOS IC.

The turn-on voltage of the PTLSCR2' device is not the original switching voltage (about 30 V to 50 V) of the lateral SCR2' device. Instead, the turn-on voltage of the PTLSCR2' device is equal to the snapback breakdown voltage of the short-channel thin-oxide PMOS Pb', which is about −13 to −15 volts in 0.8 μm CMOS technology. Thus, the lateral SCR2' is triggered on by the PMOS Pb' device at about −13 to −15 volts instead of being triggered on at about −30 to −50 volts in the ND-mode of ESD stress.

After turn-on, the holding voltage of the PTLSCR2' device is the same as the original holding voltage (about 1 V) of the lateral SCR2' device. Similarly, the turn-on resistance of the PTLSCR2' device is the same as the original turn-on resistance of the lateral SCR2' device. The turn-on resistance is very low (about 2 to 5Ω) and is used to bypass ESD currents.

Rw2a' and Rw2b' are the inherent parasitic resistances of the P-wells 1272 and 1276 respectively. Rsub2' is the inherent parasitic resistance of the N-substrate 1254. These resistances are shown in the structure 1300 of the PTLSCR2' (FIG. 13) and its equivalent circuit 1200 (FIG. 12).

Figure 14:
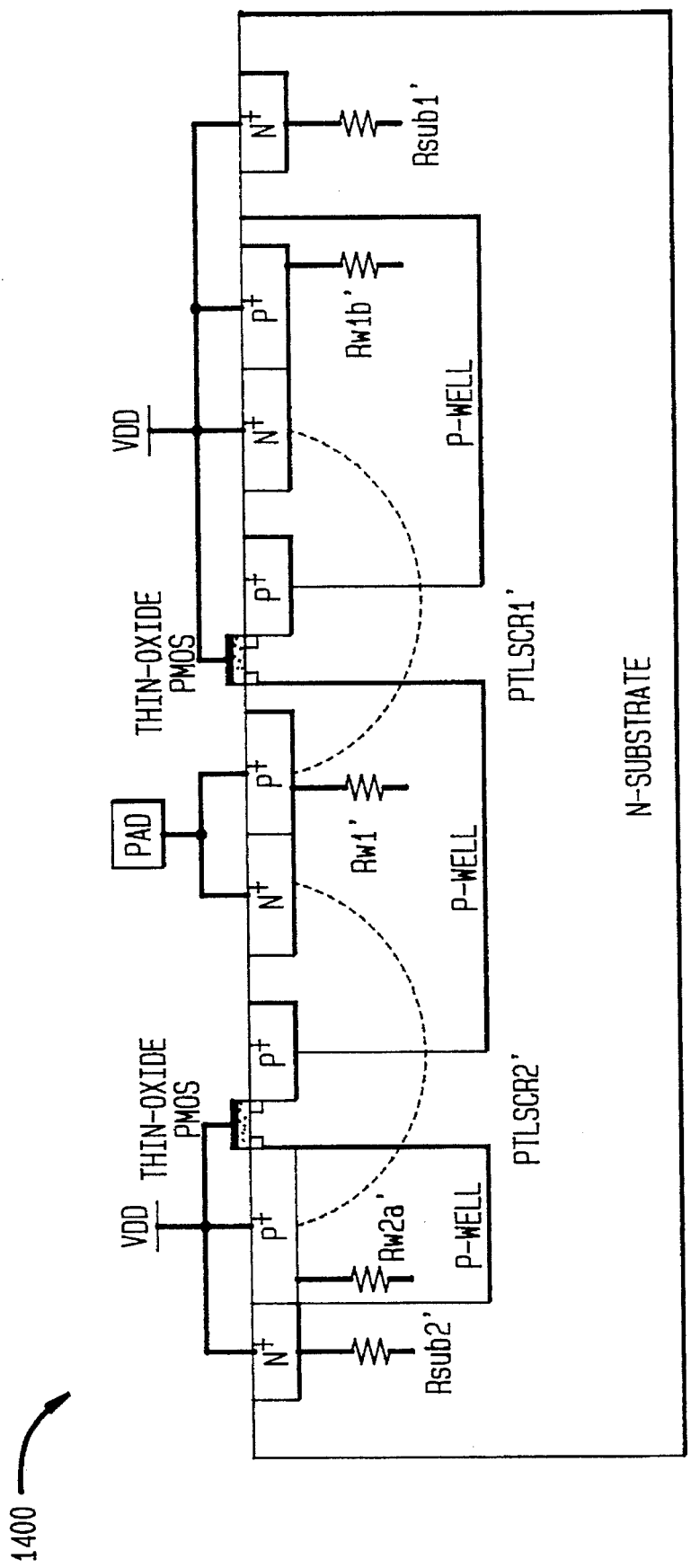
FIG. 14 shows a merged structure of the PTLSCR1' and PTLSCR2' shown in FIG. 13.

In FIG. 13, the two separated P-wells 1252, 1276 are both connected to the pad 205. The P-well 1252 is used for the PTLSCR1' while the other P-well 1276 is used for the PTLSCR2'. FIG. 14 shows a merged structure 1400 wherein these two P-wells 1252, 1276 are merged together to further reduce the layout area. The merged structure 1400 of the PTLSCR1' and PTLSCR2' devices provides similar ESD protection as the structure 1300 of FIG. 13, yet the merged structure 1400 occupies a smaller layout area.

5. Description of the NTLSCR1'

Returning to FIG. 12, the NTLSCR1' device is arranged between the pad 205 and the VSS power line with its anode 1230 connected to the pad 205 and its cathode 1240 connected to VSS which is normally grounded. The NTLSCR1' device comprises two bipolar junction transistors (BJTs) Q3a' and Q3b' and a short-channel thin-oxide NMOS device Na' The two BJTs Q3a' and Q3b' form a lateral SCR3' device, while the thin-oxide NMOS device Na' lowers the trigger voltage of the lateral SCR3' device.

Q3a' is a PNP BJT having an emitter 1322 connected to the terminal 420 of the pad 205 through a resistor Rw3a'. The base 1324 of Q3a' is connected to VDD through a resistor Rsub3' The collector 1326 of Q3a' is connected to the grounded VSS through a resistor Rw3b'.

Q3b' is an NPN BJT having an emitter 1328 connected to the grounded VSS. The base 1330 of Q3b' is connected to the collector 1326 of Q3a' The collector 1332 of Q3b' is connected to the base 1324 of Q3a'.

Na' is a short-channel thin-oxide NMOS device having a drain 1334 connected to the base 1324 of Q3a' and a source 1336 connected to the emitter 1328 of Q3b'. The gate 1338 of the Na' is connected to the grounded VSS. The bulk 1340 of Na' is connected to the base 1330 of Q3b'.

6. Description of the Layout of NTLSCR1'

FIG. 15 shows a structure 1500 which is a cross-sectional view of the NTLSCR1' and NTLSCR2' devices shown in FIG. 12, where a P-well/N-substrate CMOS structure is used as an illustrative example. The following description relates the structure 1500 of FIG. 15 to the circuit diagram 1200 of FIG. 12.

The NTLSCR1' device is formed by the lateral SCR3' device (comprised by the BJT's Q3a' and Q3b') with the short-channel thin-oxide NMOS Na' device which is merged with the SCR3' to lower the trigger voltage of the lateral SCR3' device. The purpose of inserting a thin-oxide NMOS Na' into the lateral SCR3' structure is to trigger on the lateral SCR3' at the snapback breakdown voltage of the thin-oxide NMOS Na' during ESD stress.

Q3a' is a parasitic lateral P-N-P bipolar junction transistor in the P-well/N-substrate CMOS structure. Q3a' is formed by a P+ diffusion 1505 in a P-well 1322 (acting as the emitter 1322 of Q3a'). The N-substrate 1254 acts as the base 1324 of Q3a'. Another adjacent P-well 1326 acts as the collector 1326 of Q3a'.

Q3b' is a parasitic vertical N-P-N bipolar junction transistor in the P-well/N-substrate CMOS structure. The emitter 1328 of Q3b' is formed by an N+ diffusion 1328 in the P-well 1326. The P-well 1326 acts as the base 1330 of Q3b' The N-substrate 1254 acts as the collector 1332 of Q3b'.

The thin-oxide NMOS Na' device is formed by diffusing the N+ region 1328 into the P-well 1326. The N+ region 1328 acts as the source 1336 of the NMOS Na' Another N+ region 1334, which crosses the junction between the P-well 1326 and the N-substrate 1254, is diffused into both the P-well 1326 and the N-substrate 1254. The N+ region 1334 acts as the drain 1334 of the NMOS Na' device. The P-well 1326 acts as the bulk 1340 of the NMOS Na'. The gate 1338 of the thin-oxide NMOS Na' is connected to the grounded VSS. This ensures that the NMOS Na' is off during normal operating conditions of the CMOS IC.

The turn-on voltage of the NTLSCR1' device is not the original switching voltage (about 30 V to 50 V) of the lateral SCR3' device. Instead, the turn-on voltage of the NTLSCR1 device is equal to the snapback breakdown voltage of the short-channel thin-oxide NMOS Na', which is about 13 to 15 volts in 0.8 μm CMOS technology. Thus, the lateral SCR3' is triggered on by the NMOS Na' device at about 13 to 15 volts instead of being triggered on at about 30 to 50 volts in the PS-mode of ESD stress.

After turn-on, the holding voltage of the NTLSCR1' device is the same as the original holding voltage (about 1 V) of the lateral SCR3' device. Similarly, the turn-on resistance of the NTLSCR1' device is the same as the original turn-on resistance of the lateral SCR3' device. The turn-on resistance is very low (about 2 to 5 Ω) and is used to bypass ESD currents.

Rw3a' and Rw3b' are the inherent parasitic resistances of the P-wells 1322 and 1326 respectively. Rsub3' is the inherent parasitic resistance of the N-substrate 1254. These resistances are shown in the structure 1500 of the NTLSCR1' (FIG. 15) and its equivalent circuit 1200 (FIG. 12).

7. Description of the NTLSCR2'

The NTLSCR2' device is arranged between the pad 205 and the VSS power line with its cathode 1245 connected to the pad 205 and its anode 1235 connected to VSS which is normally grounded. The NTLSCR2' device comprises two bipolar junction transistors (BJTs) Q4a' and Q4b' and a short-channel thin-oxide NMOS device Nb' The two BJTs Q4a' and Q4b' form a lateral SCR4' device, while the thin-oxide NMOS Nb' device lowers the trigger voltage of the lateral SCR4' device.

Q4a' is a PNP BJT having an emitter 1352 connected to the grounded VSS through a resistor Rw4a' The base 1354 of Q4a' is connected to VDD through a resistor Rsub4' The collector 1356 of Q4a' is connected to the terminal 420 of the pad 205 through a resistor Rw4b'.

Q4b' is an NPN BJT having an emitter 1358 connected to the terminal 420 of the pad 205. The base 1360 of Q4b' is connected to the collector 1356 of Q4a'. The collector 1362 of Q4b' is connected to the base 1354 of Q4a'.

Nb' is a short-channel thin-oxide NMOS device having a drain 1364 connected to the base 1354 of Q4a' and a source 1366 connected to the emitter 1358 of Q4b'. The gate 1368 of Nb' is connected to the grounded VSS. The bulk 1370 of Nb' is connected to the base 1360 of Q4b'.

If the input voltage at the pad 205 is below the turn-on voltage of the NMOS Nb', (the turn-on voltage is VSS-Vthn, where Vthn is the threshold voltage of the thin-oxide NMOS Nb'), then the NMOS Nb' will turn on and cause occurrence of latchup along the lateral SCR4' structure in NTLSCR2' in the NS-mode of ESD stress.

8. Description of the Layout of NTLSCR2'

The following description relates the structure 1500 of FIG. 15 to the circuit diagram 1200 of FIG. 12. The NTLSCR2' device is formed by the lateral SCR4' device (comprised by BJT's Q4a' and Q4b') with the short-channel thin-oxide NMOS Nb' device which is merged with the SCR4' to lower the trigger voltage of the lateral SCR4' device.

Q4a' is a parasitic lateral P-N-P bipolar junction transistor in the P-well/N-substrate CMOS structure. Q4a' is formed by a P+ diffusion 1510 in a P-well 1352 (acting as the emitter 1352 of Q4a'). The N-substrate 1254 acts as the base 1354 of Q4a'. Another adjacent P-well 1356 acts as the collector 1356 of Q4a'.

Q4b' is a parasitic vertical N-P-N bipolar junction transistor in the P-well/N-substrate CMOS structure. The emitter 1358 of Q4b' is formed by an N+ diffusion 1358 in the P-well 1356. The P-well 1356 acts as the base 1360 of Q4b' The N-substrate 1254 acts as the collector 1362 of Q4b'.

The thin-oxide NMOS Nb' device is formed by diffusing the N+ region 1358 into the P-well 1356. The N+ region 1358 acts as the source 1366 of the NMOS Nb' Another N+ region 1364, which crosses the junction between the P-well 1356 and the N-substrate 1254, is diffused into both the P-well 1356 and the N-substrate 1254. The N+ region 1364 acts as the drain 1364 of the NMOS Nb' device. The P-well 1356 acts as the bulk 1370 of the NMOS Nb'. The gate 1368 of the thin-oxide NMOS Nb' is connected to the grounded VSS. This ensures that the NMOS Nb' is off during normal operating conditions of the CMOS IC.

The turn-on voltage of the NTLSCR2' device is not the original switching voltage (about 30 V to 50 V) of the lateral SCR4' device. Instead, the turn-on voltage of the NTLSCR2' device is equal to the turn-on voltage of the short-channel thin-oxide NMOS Nb', which is about VSS-Vthn Volts in 0.8 μm CMOS technology, where Vthn is the threshold voltage of the thin-oxide NMOS Nb' Thus, the lateral SCR4' is triggered on by the NMOS Nb' device at about VSS-Vthn Volts instead of being triggered on at about −30 to −50 volts in the NS-mode of ESD stress.

After turn-on, the holding voltage of the NTLSCR2' device is the same as the original holding voltage (about 1 V) of the lateral SCR4' device. Similarly, the turn-on resistance of the NTLSCR2' device is the same as the original turn-on resistance of the lateral SCR4' device. The turn-on resistance is very low (about 2 to 5 Ω) and is used to bypass ESD currents.

Rw4a' and Rw4b' are the inherent parasitic resistances of P-wells 1352 and 1356, respectively. Rsub4' is the inherent parasitic resistance of the N-substrate 1254. These resistances are shown in the structure 1500 of the NTLSCR2' (FIG. 15) and its equivalent circuit 1200 (FIG. 12).

Figure 16:
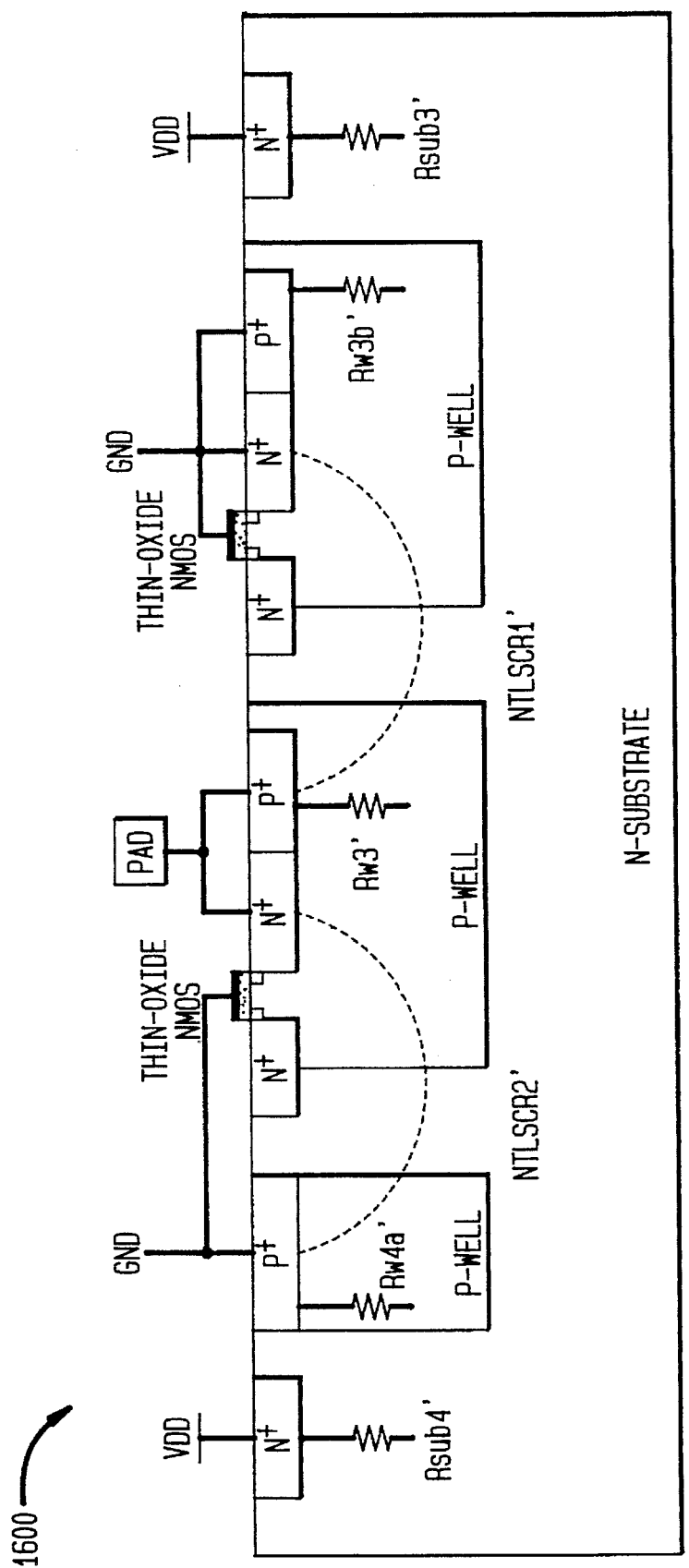
FIG. 16 shows a merged structure of the NTLSCR1' and NTLSCR2' shown in FIG. 15.

In FIG. 15, the two separated P-wells 1322, 1356 are both connected to the pad 205. The P-well 1322 is used for the NTLSCR1' while the other P-well 1356 is used for the NTLSCR2' FIG. 16 shows a merged structure 1600 wherein these two P-wells 1322, 1356 are merged together to further reduce the layout area. The merged structure 1600 of the NTLSCRI' and NTLSCR2' devices provides similar ESD protection as the structure 1500 of FIG. 15, yet the merged structure 1600 occupies a smaller layout area.

The turn-on voltage of the PTLSCR2' (NTLSCR1') device is equivalent to the snapback breakdown voltage of the short-channel PMOS (NMOS) device. The snapback breakdown voltage of the PMOS Pb' (NMOS Na') is about −13 V to −15 V (13 V to 15 V) in 0.8 μm CMOS technology. The turn-on voltage of the PTLSCR2' and NTLSCR1' devices is much lower than the original switching voltage of a lateral SCR' device which is about 30 V to 50 V.

On the other hand, the turn-on voltage of the PTLSCR1' (NTLSCR2') device is equivalent to the turn-on voltage of the short-channel PMOS (NMOS) device. The turn-on voltage of the PMOS Pa' (NMOS Nb') device is about VDD+ |Vthp| (VSS-Vthn) in 0.8 μm CMOS technology. The turn-on voltage of the PTLSCR1' and NTLSCR2' devices is much lower than the original switching voltage of a lateral SCR' device which is about 30~50 V.

The snapback breakdown voltage of the short-channel thin-oxide PMOS and NMOS devices is dependent on the CMOS technologies. Generally this snapback breakdown voltage is lower than the breakdown voltage of gate-oxide CMOS devices in the same CMOS technology. Thus, the PTLSCR' and NTLSCR' devices, which have thin-oxide devices, turn on or trigger on the lateral SCRs at the low snapback breakdown voltages of the PMOS Pb' and NMOS Na' devices. Therefore, the inventive four-LVTSCR circuit can alone protect CMOS input stages without additional secondary protection elements.

Figure 1A:
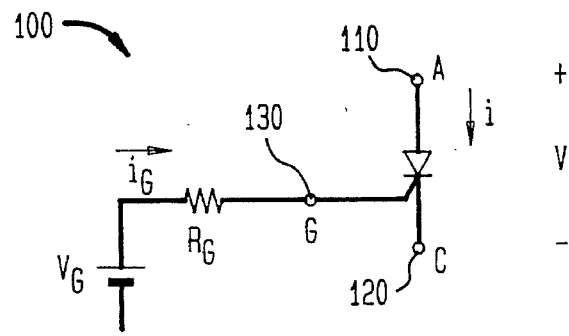
FIG. 1a shows a circuit representation of a lateral SCR device.
Figure 1B:
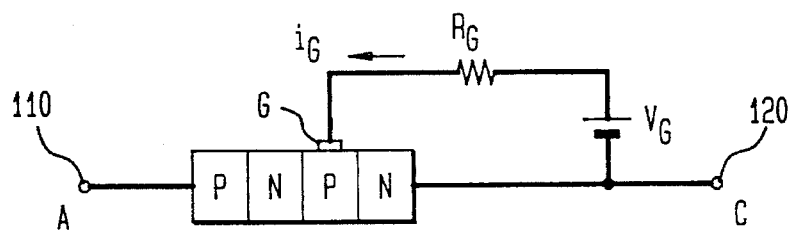
Figure 1C:
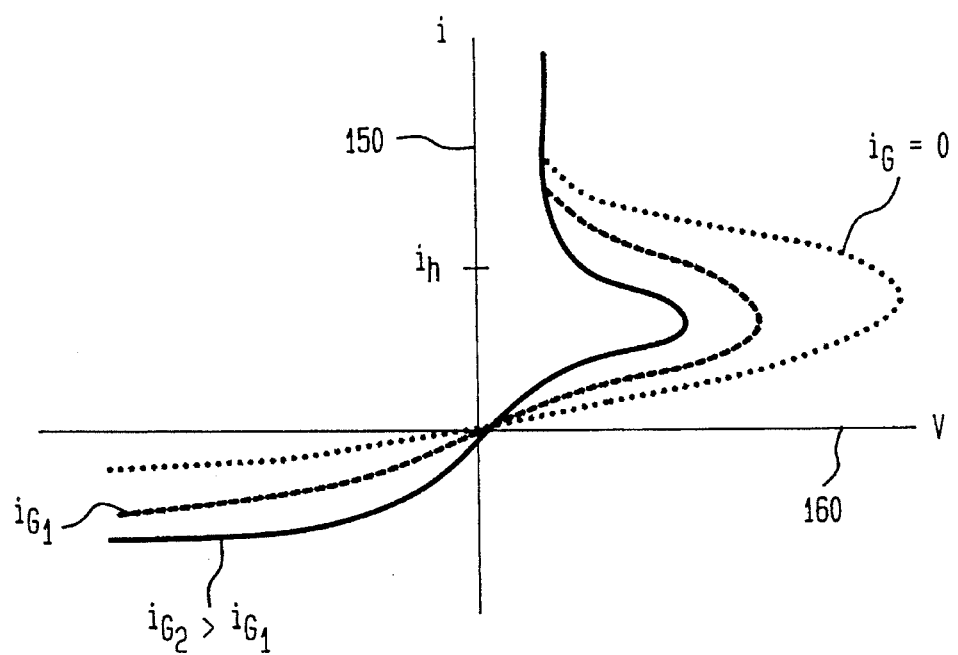
Figure 2:
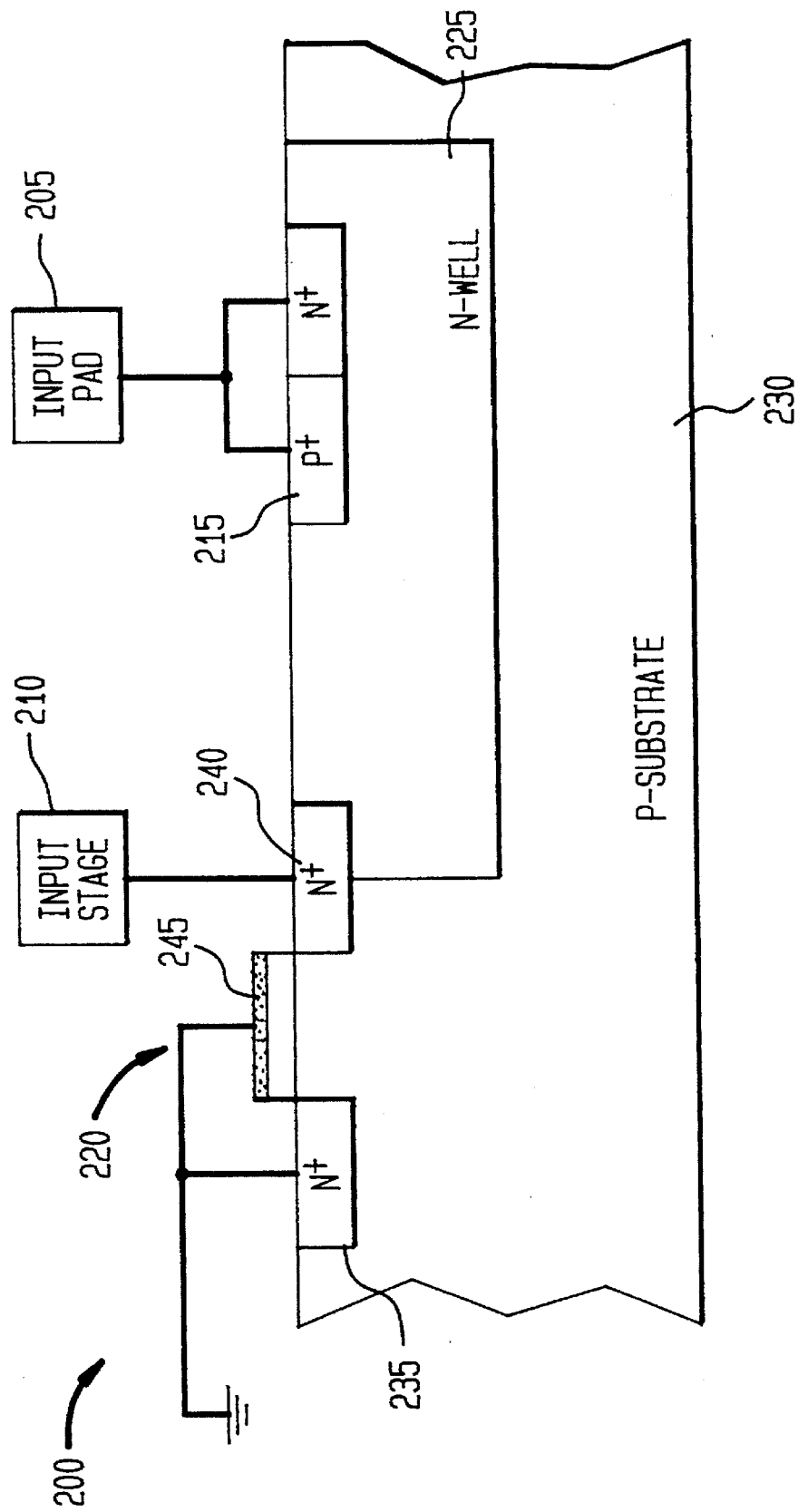
FIG. 2 shows the semiconductor regions of a conventional LVTSCR device used as an ESD protection circuit.
Figure 3:
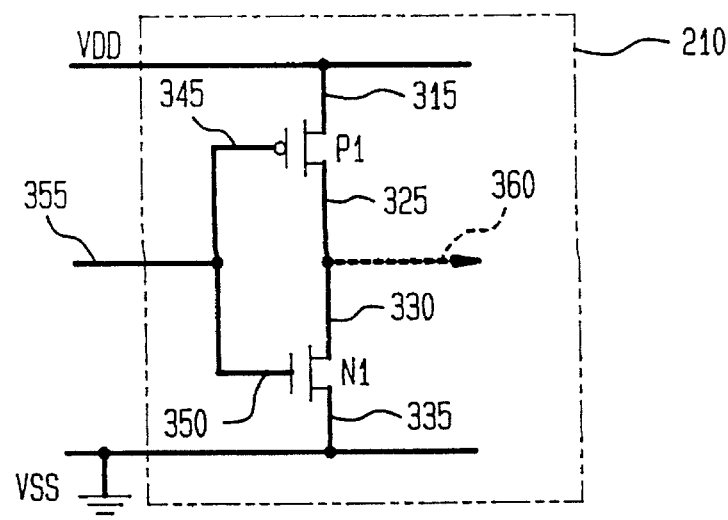
FIG. 3 shows a typical input stage of a CMOS IC chip which is to be protected against ESD damage.
Figure 4:
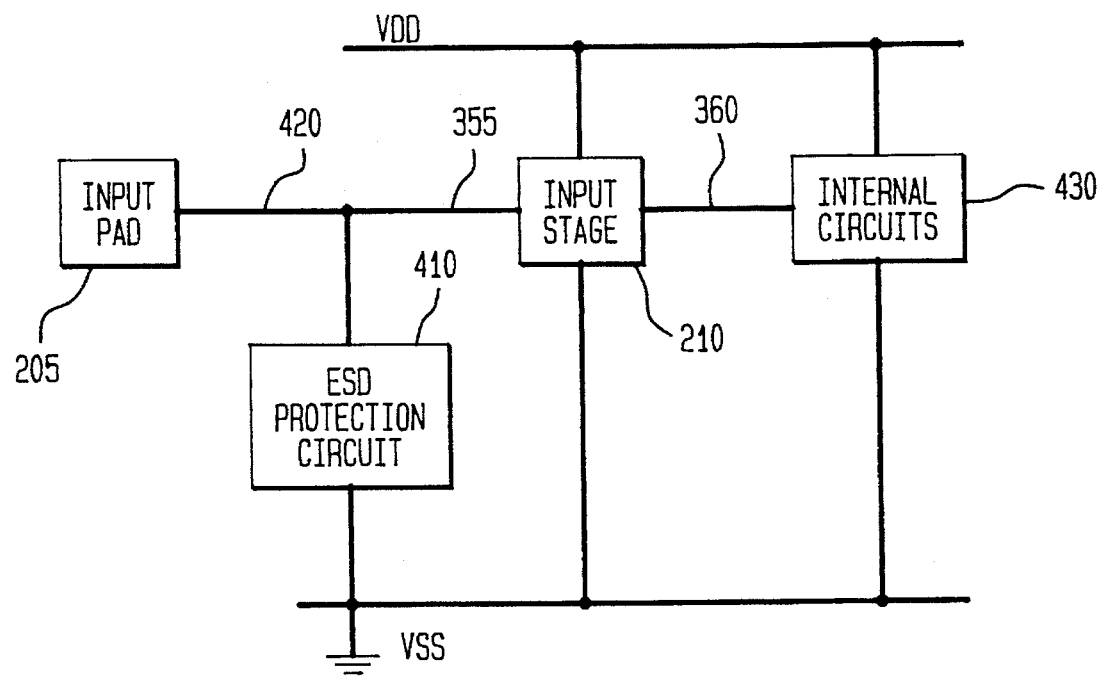
FIG. 4 shows a block diagram of a conventional ESD protection circuit with protection elements only arranged between an input pad and VSS.

The turn-on voltage of the LVTSCRs (PTLSCR1, PTLSCR2, NTLSCR1 and NTLSCR2 of FIG. 5 and PTLSCR1', PTLSCR2', NTLSCR1' and NTLSCR2' of FIG. 12) is out of the range from 0 V to 5 V, which is the voltage range used during normal operation of the MOS devices N1, P1 of the input stage 210. Therefore, the LVTSCRs provide ESD protection without adversely affecting the operation of the input stage 210 because the LVTSCRs remain off at 5 volts which is the normal operating voltage of the MOS devices P1, N1 of the input stage 210 (FIG. 3).

D. Circuit Operating Principles

1. CMOS Normal-Operating Conditions

The operation of the inventive four-LVTSCR ESD protection circuit is described below using the illustrative embodiments 500 shown in FIG. 5 with N-well/P-substrate CMOS structure. However, similar operating principles are applicable to the circuit 1200 in FIG. 12 with the P-well/N-substrate CMOS structure.

In CMOS normal operations, the VDD is biased on 5 V and VSS is grounded. Under this condition, in FIG. 5 (N-well/P-substrate CMOS structure), the thin-oxide PMOS Pa, Pb devices in the PTLSCR1 and PTLSCR2 structures are kept off because their gates 568, 588 are connected to VDD. The thin-oxide NMOS Na, Nb devices in the NTLSCR1 and NTLSCR2 structures are also kept off because their gates 738, 768 are connected to ground. Thus, the PTLSCR1, PTLSCR2, NTLSCR1, and NTLSCR2 devices are all inactive in the normal-operating conditions of the CMOS IC chip.

The inventive four-LVTSCR ESD protection circuit also provides a voltage-level clamping effect on the input signals. In FIG. 5 (N-well/P-substrate CMOS structure), the base-emitter junctions of Q2b (in PTLSCR2) and Q4b (in NTLSCR2) act as diodes with the anode of the diode connected to VSS(GND) and its cathode connected to the pad 205. These diodes clamp the low-level voltage of input signal to about VSS−0.6 V.

The thin-oxide PMOS Pa in PTLSCR1 structure also performs a voltage clamping effect on the input signal. If the high-level voltage of the input signal is over (VDD+|Vthp|), where Vthp is the threshold voltage of thin-oxide PMOS Pa, then the thin-oxide PMOS Pa in PTLSCR1 will conduct. This clamps the high-level voltage of the input signal. Thus, the voltage level of the input signal is clamped between about 6 to −0.6 volts in normal CMOS operations where VDD is 5 V and VSS is grounded.

In FIG. 12 (P-well/N-substrate CMOS structure), the high-level voltage of the input signal is clamped by the emitter-base junctions of Q1a' and Q3a' to about VDD+0.6 V. The low-level voltage of the input signal is clamped by the thin-oxide NMOS Nb' in NTLSCR2'. If the input signal is below VSS−Vthn, where Vthn is the threshold voltage of the thin-oxide NMOS Nb', the NMOS Nb' in NTLSCR2' will conduct to clamp the low-level voltage to about VSS−Vthn. Thus, the voltage level of the input signal is clamped between about 5.6 to −1.0 volts in normal CMOS operations where VDD is 5 V and VSS is grounded.

2. ESD-Stress Conditions:

There are four modes of ESD stress conditions appearing on a signal pin of the IC chip connected to the pad 205. The four modes are associated with positive and negative polarities of the ESD voltages relative to both VDD and VSS buses which are connected to the VSS and VDD pins of the IC chip.

The inventive four-LVTSCR ESD protection circuit protects against all four ESD stress modes. Each one of the four-LVTSCR$_S$ provides a separate ESD path for protection against one of the four ESD stress modes as follows:

PS—mode NTLSCR1 (NTLSCR1')
NS—mode NTLSCR2 (NTLSCR2')
PD—mode PTLSCR1 (PTLSCR1')
ND—mode PTLSCR2 (PTLSCR2')

a. PS-Mode: Protected by NTLSCR1

In FIGS. 5, 8 (N-well/P-substrate CMOS structure), when PS-mode ESD events occur, the positive ESD voltage is diverted to the anode 530 of NTLSCR1. Next, the ESD voltage is diverted to the drain 734 (N+ diffusion region 734 across the N-well 724 and P-substrate 726 junction in FIG. 8) of the thin oxide NMOS Na due to the forward conducting junctions of the P+ diffusion region 722/N-well 724/N+ diffusion region 734 shown in FIG. 8.

The thin-oxide NMOS Na in NTLSCR1 is first turned on due to the snapback breakdown condition of its drain 734. This clamps the positive ESD voltage on the pad 205 to the voltage level of the snapback breakdown voltage (which is about 13 to 15 volts in 0.8 μm CMOS technology, dependent on CMOS structure,) of the thin-oxide NMOS Na.

As the snapback breakdown condition occurs in the drain 734 of the NMOS Na, the ESD current is shunted from the N-well 724 (base 724 BJT Q3a), through the drain 734 of the thin-oxide NMOS Na, to the P-substrate 726 (base 730 of BJT Q3b, also the bulk 740 of thin-oxide NMOS Na). Next, the ESD current flows to the N+ diffusion 736 in the adjacent N-well 728 (source 736 of thin-oxide NMOS, also the emitter 728 of BJT Q3b).

This ESD current, flowing from the N-well 724 to the P-substrate 726, has a beneficial effect which leads to the self-regeneration of latchup in the NTLSCR1 device. Once latchup occurs in the NTLSCR1, a path with very low impedance from the pad 205 to VSS(GND) is created. Now, the ESD current is mainly discharged to ground through the lateral SCR3 structure of the NTLSCR1 device.

The ESD voltage on the pad 205 is clamped by the holding voltage of the turned-on lateral SCR3 structure to about 1V. This protects the input stage 210 which is connected to the pad 205. The purpose of inserting a thin-oxide into the lateral SCR3 structure, which forms the NTLSCR1 device, is to use the drain 734 of the thin-oxide NMOS Na in the snapback breakdown condition. This triggers on the lateral SCR3 structure during ESD stress at the low snapback breakdown voltage (about 13V to 15V) of the NMOS Na.

Thus, the NTLSCR1 device effectively protects CMOS ICs against PS-mode ESD damages alone without additional secondary protection elements. Furthermore, due to the capability of power delivery in the lateral SCR3 device, the inventive circuit provides robust ESD protection since the NTLSCR1 device (as well as the PTLSCR1, PTLSCR2 and NTLSCR2 devices) can sustain high ESD stress in a small layout area with a low trigger voltage.

b. NS-Mode: Protected by NTLSCR2

In NS-mode ESD events, ESD stress occurs between the pad 205 and the VSS(GND) pin with negative polarity to VSS(GND) while the VDD is floating. Negative ESD voltage is diverted through the cathode 545 (FIG. 5) of NTLSCR2 to the source 766 of the thin-oxide NMOS Nb. The drain 764 and gate 768 of the thin-oxide NMOS Nb are relatively grounded in this ESD-stress condition.

The thin-oxide NMOS Nb in the NTLSCR2 is first turned on because Vgs is greater than Vthn (Vgs>Vthn), where Vgs is the gate 768 to source 766 voltage of the NMOS Nb and Vthn is the threshold voltage of the NMOS Nb. The turned-on NMOS Nb clamps the negative ESD voltage on the pad 205.

The ESD current flowing from the N-well 754 (FIG. 8) to the P-substrate 726, due to the turned-on thin-oxide NMOS Nb, has a beneficial effect which leads to the self-regeneration of latchup in the NTLSCR2 device. Once latchup occurs in the NTLSCR2, a path with very low impedance from VSS (GND) to the pad 205 is created. Now, the ESD current is mainly discharged to ground through the lateral SCR4 structure of NTLSCR2 device.

The negative ESD voltage on the pad 205 is clamped by the holding voltage of the turned-on lateral SCR4 structure to about −1 V. This protects the input stage 210 which is connected to the pad 205.

As shown in FIGS. 5 and 8, the cathode 545 of the NTLSCR2 structure is made by N+ diffusion region 766 in the N-well 758 which is surrounded by P-substrate 726. The P-substrate 726 is connected to VSS(GND) through substrate resistance Rsub4. This N-well 758/P-substrate 726 junction forms a parasitic diode from VSS to the pad 205. This parasitic diode is in parallel with the NTLSCR2 device and also acts as an ESD protection element.

If Rsub4 is large, then the NTLSCR2 device is triggered on by the inserted thin-oxide NMOS Nb device as described above. If Rsub4 is small enough, which depends on the layout style, the parasitic diode will be first turned on during the NS-mode of ESD stress. This also triggers on the NTLSCR2 device. Although the diode is parasitic, it is essential in any N-well/P-substrate CMOS structure and has the beneficial effect described above. Thus, the NTLSCR2 device effectively protects CMOS ICs against NS-mode ESD damage without the need for additional secondary protection elements.

c. PD-Mode: Protected by PTLSCR1

In PD-mode ESD events, at an input pin connected to the pad 205, an ESD voltage occurs which is positive with respect to a grounded VDD pin while the VSS pin is floating. The positive ESD voltage is diverted to the anode 510 of the PLTSCR1 and to the source 566 and bulk 570 of the thin-oxide PMOS Pa as shown in FIGS. 5 and 8. The drain 564 of thin-oxide PMOS Pa is relatively grounded through the forward biased junctions of the P+ diffusion region 564 / P-substrate 556 / N-well 558 shown in FIG. 6. These junctions are forward biased in this ESD-stress condition because the cathode 520 of PTLSCR1 (N+ diffusion region 610 in the N-well 558, which is also the emitter 558 of the BJT Q1$b$,) is grounded in the PD-mode ESD event.

The thin-oxide PMOS Pa in the PTLSCR1 is first turned on because Vgs is less than Vthp (Vgs<Vthp), where Vgs is the gate 568 to source 566 voltage of the PMOS Pa, and Vthp is the threshold voltage of the PMOS Pa and is a negative value. The turned-on PMOS Pa clamps the positive ESD voltage on the pad 205.

The conducting thin-oxide PMOS Pa also leads to the self-regeneration of latchup in the PLTSCR1 device. Once latchup occurs in PLTSCR1, a path with very low impedance from the pad 205 to VDD is created. Now, the ESD current is mainly discharged by the lateral SCR1 structure of the PTLSCR1 device.

The ESD voltage on the pad 205 is clamped by the holding voltage of the turned-on lateral SCR1 structure to about 1V. This protects the input stage 210 which is connected to the pad 205. Thus, the PTLSCR1 device effectively protects CMOS ICs against PD-mode ESD damage without the need for additional secondary protection elements.

d. ND-Mode: Protected by PTLSCR2

In ND-mode ESD events, at an input pin connected to the pad 205, an ESD event occurs which is negative with respect to VDD while VSS is floating. The negative ESD voltage is diverted to the cathode 525 of the PLTSCR2 and then to the drain of thin-oxide PMOS Pb due to the forward biased and forward conducting junctions of the N-well 578/P-substrate 556/P+ diffusion region (drain of Pb) 584.

The thin-oxide PMOS Pb in the PTLSCR2 is first turned on due to the snapback breakdown condition occurring in the drain 584 of the PMOS Pb. This clamps the negative ESD voltage on the pad 205 to the voltage level of the snapback breakdown voltage of thin-oxide PMOS Pb. The current, which is due to snapback breakdown condition of the drain 584 of the PMOS Pb, is beneficial and leads to the latchup in the lateral PLTSCR2 device. Once the latchup occurs in the PTLSCR2, the ESD current is mainly discharged by its lateral SCR2 structure. The negative ESD voltage on the pad 205 is clamped by the holding voltage of lateral SCR2 structure to about −1 V. Therefore, the input stage 210 and the internal circuits connected thereto are protected.

In short, the present invention is an ESD protection circuit which has four different ESD direct discharging paths arranged to bypass ESD stress with any voltage/current polarity. These paths protect against four modes of ESD stresses. Therefore, the inventive circuit fully protects the input stage of a CMOS IC chip against unexpected ESD damages. The present invention provides a robust ESD protection and has a high ESD failure threshold in a smaller layout area. The four modes of ESD stresses on each input pin are one-by-one protected by the PTLSCR1, PTLSCR2, NTLSCR1 and NTLSCR2 devices.

Illustratively, the inventive circuit has a layout area of approximately 88×177 μm$^2$, which includes the VDD-to-VSS latchup guard rings. The inventive circuit protects against ESD levels in excess of 5 kilovolts HBM (human body mode) ESD stresses with either positive or negative polarities to both the VDD and the VSS nodes in submicron CMOS technology with LDD and silicide processes.

In addition, the inventive ESD protection circuit not only performs the ESD protection by shunting ESD currents away from the internal circuits, but also provides a voltage clamping effect on the input signals.

Although there are four LVTSCR devices used in the inventive ESD protection circuit, the inventive circuit provides higher ESD failure threshold in a smaller layout area. In contrast, conventional ESD protection circuits in submicron CMOS ICs with LDD and silicide diffusion technologies which are made (using CMOS structure) by diodes, thin-oxide devices, bipolar devices, or field-oxide devices have a large layout area without effective protection against high ESD stress in all four ESD modes.

The inventive ESD protection scheme is formed by four low-voltage trigger SCR devices (LVTSCR), called PTLSCR1, PTLSCR2, NTLSCR1, and NTLSCR2 devices.

The PTLSCR1 device (or PTLSCR2) is made by inserting a short-channel thin-oxide PMOS device into its lateral SCR structure. The NTLSCR1 device (or NTLSCR2) is made by inserting a short-channel thin-oxide NMOS device into its lateral SCR structure. These short-channel thin oxide PMOS and NMOS devices are used to trigger on the lateral SCR structures during ESD stresses. The trigger voltage of each one of the four LVTSCRs is no longer the original switching voltage of its lateral SCR device. Rather, the trigger voltages of PTLSCR2 and NTLSCR1 (PTLSCR1 and NTLSCR2) are lowered to the drain snapback breakdown voltages (the normal turn-on voltages) of the short-channel thin-oxide PMOS and NMOS devices respectively. However, the holding voltages of the LVTSCR devices are still the same as the holding voltages of the lateral SCR of about 1 volt.

In the present invention, the lateral SCR device is not triggered on by means of a capacitance-couple effect wherein the capacitance value is difficult to precisely and consistently control in each lateral SCR structure in different CMOS structures. Instead, in the present invention, the lateral SCR device is triggered on by the drain snapback breakdown condition or the normal turn-on voltages of the thin-oxide NMOS and PMOS devices. The drain snapback breakdown condition of thin-oxide NMOS or PMOS can be well controlled in different CMOS structures because the drain snapback breakdown condition is a DC behavior rather than a transient behavior such as that of a transient current between capacitances. Therefore, the trigger voltage of PTLSCR1, PTLSCR2, NTLSCR1 and NTLSCR2 are well controlled in any different CMOS structure. This makes the present invention to be easily, precisely and consistently designed and controlled in different CMOS technologies.

Furthermore, the particular connection of the anodes and cathodes of the four LVTSCRs are not made only by a heavily doped diffusion in a substrate. Instead, the cathodes, for example, are made by an N+ diffusion in an N-well. The N-well provides a deeper junction depth into the P-substrate. This offers additional current discharging paths along the P-N-P-N structure of lateral SCR device. Therefore, the inventive four-LVTSCR ESD protection circuit sustains higher ESD stress.

The inventive ESD protection circuit is also free of the VDD-to-VSS latchup problem in 5 V CMOS ICs. The inventive circuit is very suitable for advanced submicron CMOS ICs in high-density and high-speed applications. The fabrication of the inventive ESD protection circuit is fully process-compatible and suitable with both CMOS and BiCMOS technologies with N-well/P-substrate, P-well/N-substrate, or twin-well processes.

The present invention also discloses an integrated circuit incorporating the inventive ESD protection circuit in a small layout area. The layout efficiency of the inventive ESD protection circuit is further improved by merging two separated wells that are both connected to the pad.

The above-described embodiment of the present invention is intended to be illustrative only. Numerous alternative embodiments may be devised by those skilled in the art without departing from the spirit and scope of the following claims.

We claim:

1. A CMOS ESD protection circuit comprising:

a first lateral SCR having a cathode connected to a first supply voltage and an anode connected to a pad and which includes a first thin-oxide PMOS device which triggers the first lateral SCR at the turn-on voltage of the first thin-oxide PMOS device;

a second lateral SCR having an anode connected to the first supply voltage and a cathode connected to the pad and which includes a second thin-oxide PMOS device which triggers the second lateral SCR at the snapback breakdown voltage of the second thin-oxide PMOS device;

a third lateral SCR having an anode connected to the pad and a cathode connected to a second supply voltage and a first thin-oxide NMOS device which triggers the third lateral SCR at the snapback breakdown voltage of the first thin-oxide NMOS device; and a fourth lateral SCR having a cathode connected to the pad and an anode connected to the second supply voltage and a second thin-oxide NMOS device which triggers the fourth lateral SCR at the turn-on voltage of the second thin-oxide NMOS device.

2. The CMOS ESD protection circuit of claim 1 wherein said ESD protection circuit has a N-well/P-substrate structure.

3. The CMOS ESD protection circuit of claim 1 wherein said ESD protection circuit has a P-well/N-substrate structure.

4. The device of claim 1 wherein said cathode of said first lateral SCR comprises an $N^+$ region formed in an N-well in a P-substrate.

5. The CMOS ESD protection circuit of claim 1 wherein said first lateral SCR further comprises a first bipolar transistor having an emitter which is said anode of said first lateral SCR and is connected to a source of said first thin-oxide PMOS device, and a second bipolar transistor having a base connected to a drain of said first thin-oxide PMOS device, a base of said first bipolar transistor being connected to a collector of said second bipolar transistor.

6. A CMOS ESD protection circuit comprising:

a first low voltage trigger SCR device connected between VDD and a pad, the first low voltage trigger SCR device comprising a first lateral SCR having a cathode connected to VDD and an anode connected to the pad, and a first thin-oxide PMOS device arranged to trigger the first lateral SCR at the turn-on voltage of the first thin-oxide PMOS device;

a second low voltage trigger SCR device connected between VDD and the pad, the second low voltage trigger SCR device comprising a second lateral SCR having an anode connected to VDD and a cathode connected to the pad, and a second thin-oxide PMOS device arranged to trigger the second lateral SCR at the snapback breakdown voltage of the second thin-oxide PMOS device;

a third low voltage trigger SCR device connected between the pad and VSS, said third low voltage trigger SCR comprising a third lateral SCR having an anode connected to the pad and a cathode connected to VSS, and a first thin-oxide NMOS device arranged to trigger the third lateral SCR at the snapback breakdown voltage of the first NMOS device; and a fourth low voltage trigger SCR device connected between the pad and VSS, said fourth low voltage trigger SCR device comprising a fourth lateral SCR having a cathode connected to the pad and an anode connected to VSS, and a second thin-oxide NMOS device arranged to trigger the fourth lateral SCR at the turn-on voltage of the second thin-oxide NMOS device, said turn-on and snapback breakdown voltages of said thin-oxide devices being lower than trigger voltages of said lateral SCRs.

* * * * *